United States Patent [19]

Ohashi et al.

[11] Patent Number: 5,028,963
[45] Date of Patent: Jul. 2, 1991

[54] IMAGE FORMING APPARATUS

[75] Inventors: Kunio Ohashi, Nara; Syoichi Nagata, Yamatokoriyama, both of Japan

[73] Assignee: Sharp Kabushiki Kaisha, Osaka, Japan

[21] Appl. No.: 256,998

[22] Filed: Oct. 13, 1988

[30] Foreign Application Priority Data

| Oct. 15, 1987 | [JP] | Japan | 62-260677 |
| Oct. 23, 1987 | [JP] | Japan | 62-268791 |
| Oct. 23, 1987 | [JP] | Japan | 62-268793 |
| Oct. 23, 1987 | [JP] | Japan | 62-268796 |
| Dec. 24, 1987 | [JP] | Japan | 62-328742 |
| Dec. 25, 1987 | [JP] | Japan | 62-331824 |
| Dec. 25, 1987 | [JP] | Japan | 62-331825 |
| Dec. 25, 1987 | [JP] | Japan | 62-331826 |

[51] Int. Cl.$^5$ .......................................... G03B 27/32
[52] U.S. Cl. .................................. 355/27; 355/37; 355/41
[58] Field of Search ............. 355/27, 28, 32, 35, 355/37, 38, 67, 70, 71, 88, 83, 115

[56] References Cited

U.S. PATENT DOCUMENTS

| 4,482,264 | 11/1984 | Arney et al. | 430/138 |
| 4,678,319 | 7/1987 | Reiterer | 355/35 |
| 4,760,426 | 7/1988 | Taniguchi et al. | 355/27 |
| 4,809,049 | 2/1989 | Okuzawa et al. | 355/28 |
| 4,843,431 | 6/1989 | Horiguchi et al. | 355/38 |
| 4,910,550 | 3/1990 | Ohashi et al. | 355/27 |

Primary Examiner—L. T. Hix
Assistant Examiner—Khanh Dang

[57] ABSTRACT

An image forming apparatus including an auxiliary exposure device, in which a photoreceptive sheet coated with photosensitive microcapsules coated is subjected to image forming exposure and auxiliary exposure so as to form a selectively set image thereon by the microcapsules. The auxiliary exposure device includes a light source lamp, a plurality of filters for absorbing or reflecting portions of light of the light source lamp according to specific ranges of wavelengths of the portions of the light of the light source lamp, respectively and a setting member for setting ratios of areas of the light source lamp covered by the filters, respectively.

22 Claims, 18 Drawing Sheets

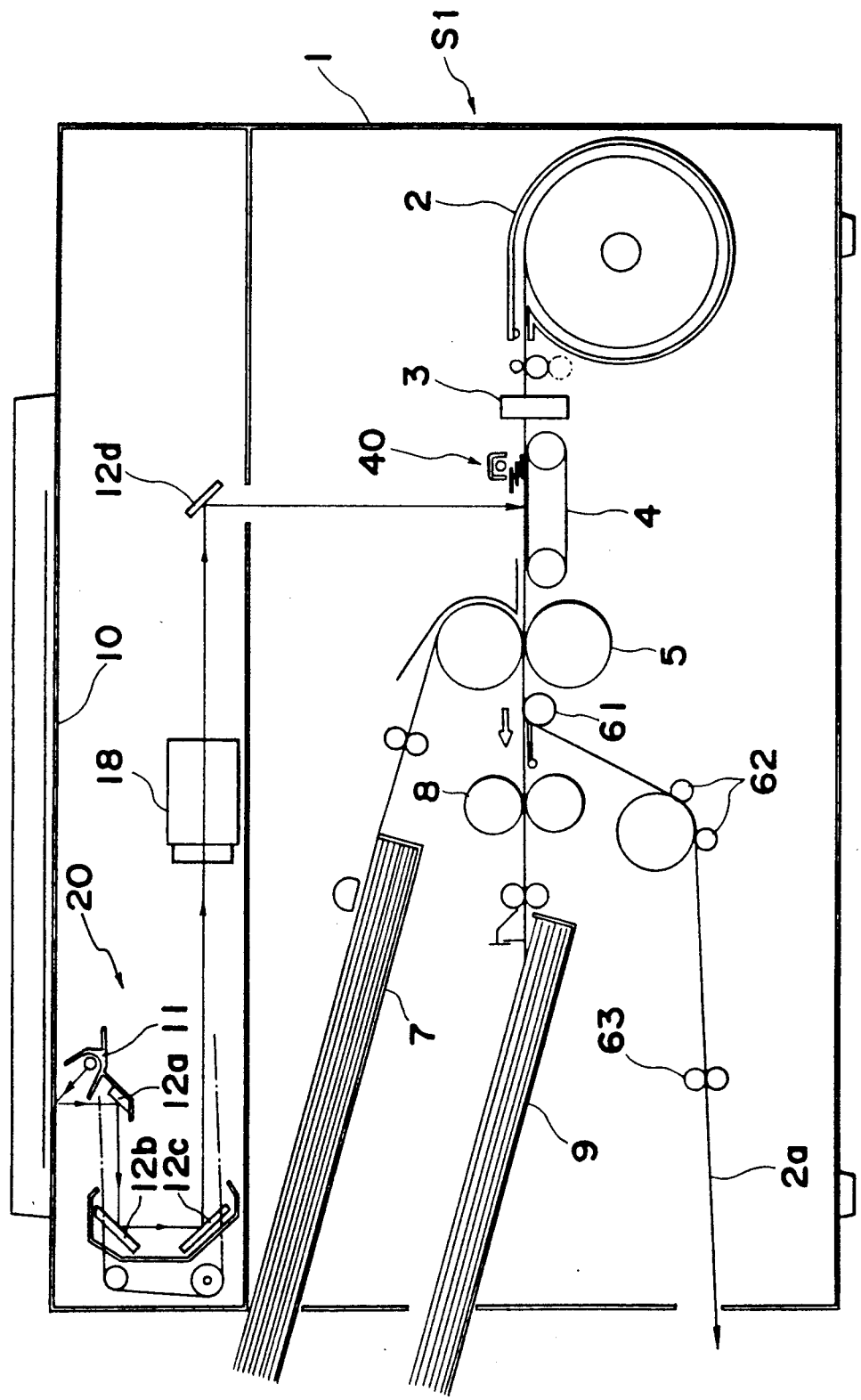

IMAGE FORMING APPARATUS

BACKGROUND OF THE INVENTION

The present invention relates to an image forming apparatus such as a copying apparatus, a printer or the like, in which a selectively set image is formed by a photoreceptive sheet coated with photosensitive microcapsules.

Such an image forming method is known in which a photoreceptive sheet coated with three kinds of photosensitive microcapsules containing colorless dyes of yellow, magenta and cyan and photo-setting materials sensitive to blue, green and red light, respectively is exposed by image forming exposure light having color information so as to form a selectively set image thereon and an image receiving sheet coated with developing materials for effecting color development of the colorless dyes is placed on the photoreceptive sheet so as to be pressed against the photoreceptive sheet such that a color image is formed on the image receiving sheet. By this known image forming method, a full-color image can be formed by a single exposure operation and thus, an image forming process can be simplified.

In the known image forming method, the above described three kinds of -photosensitive microcapsules have different photo-setting properties including photosensitivity, gamma characteristics, and, the like according to the kinds of photo-setting materials contained therein. Thus, the known image forming method has such a drawback that even when the three kinds of the photosensitive microcapsules have been exposed to an identical quantity of blue, green and red light, respectively, colors of a formed image have different densities due to differences in the photo-setting characteristics among the photosensitive microcapsules.

Thus, the present inventors have proposed in Japanese Patent Application No. 198746/1987, an auxiliary exposure device which is provided with three kinds of light source lamps for irradiating blue, green and red light, respectively. By this auxiliary exposure device, apparent photo-setting characteristics of the three kinds of the photosensitive microcapsules are made identical with one another and an excellent image can be obtained by correcting the colors of the formed image.

In this auxiliary exposure device, three kinds of tungsten lamps, such as a blue tungsten lamp (a lamp for irradiating white light), a green tungsten lamp and a red tungsten lamp are, respectively, provided with a filter permeable to blue light, a filter permeable to green light and a filter permeable to red light. Namely, the three kinds of the tungsten lamps are required to be provided for blue, green and red light, respectively and three control circuits are also required to be provided for the tungsten lamps, respectively. Hence, this auxiliary exposure device has such disadvantages that its manufacturing cost rises due to an increase in the number of its components and its structure becomes complicated. Meanwhile, even if LEDs or EL panels are employed in place of the above described lamps having the filters attached thereto, such inconveniences are incurred that the manufacturing cost rises due to an increase of the number of the lamps and the structure becomes complicated.

SUMMARY OF THE INVENTION

Accordingly, an essential object of the present invention is to provide, with a view to eliminating the disadvantages inherent in conventional image forming apparatuses, an image forming apparatus provided with an auxiliary exposure device in which a plurality of filters are provided for a single lamp and ratios of areas of the lamp covered by the filters, respectively, can be changed such that manufacturing cost of the image forming apparatus is lowered by reducing the number of components of the auxiliary exposure device.

In order to accomplish this object of the present invention, there is provided an image forming apparatus embodying the present invention including an auxiliary exposure device, in which a photoreceptive sheet coated with photosensitive microcapsules is subjected to image forming exposure and auxiliary exposure so as to form a selectively set image thereon by the photosensitive microcapsules, said auxiliary exposure device comprising: a light source lamp; a plurality kinds of filters for absorbing or reflecting portions of light of said light source lamp according to specific ranges of wavelengths of the portions of the light of said light source lamp, respectively; and setting means for setting ratios of areas of said light source lamp covered by said filters, respectively.

In the image forming apparatus including the auxiliary exposure device, according to the present invention, by setting the ratios of areas in which the light source lamp is covered by a plurality of kinds of the filters, respectively, spectral characteristics of auxiliary exposure can be changed according to the ratios of areas. For example, if the ratio of the area in which the light source lamp is covered by a filter for absorbing or reflecting light having a wavelength of blue color, the light having a wavelength of blue color, which is irradiated onto the photoreceptive sheet, is reduced and thus, the formed image becomes yellowish. Likewise, by changing the ratios of the areas in which the light source lamp is covered by the filters for absorbing the portions of the light having the wavelengths of other colors, the colors of the formed image can be corrected through a change of spectral characteristics of light used for auxiliary exposure.

BRIEF DESCRIPTION OF THE DRAWINGS

This object and features of the present invention will become apparent from the following description taken in conjunction with the preferred embodiments thereof with reference to the accompanying drawings, in which:

FIG. 3 is a schematic view of the copying apparatus of FIG. 1;

Before the description of the present invention proceeds, it is to be noted that like parts are designated by like reference numerals throughout several views of the accompanying drawings.

DETAILED DESCRIPTION OF THE INVENTION

Figure 1:
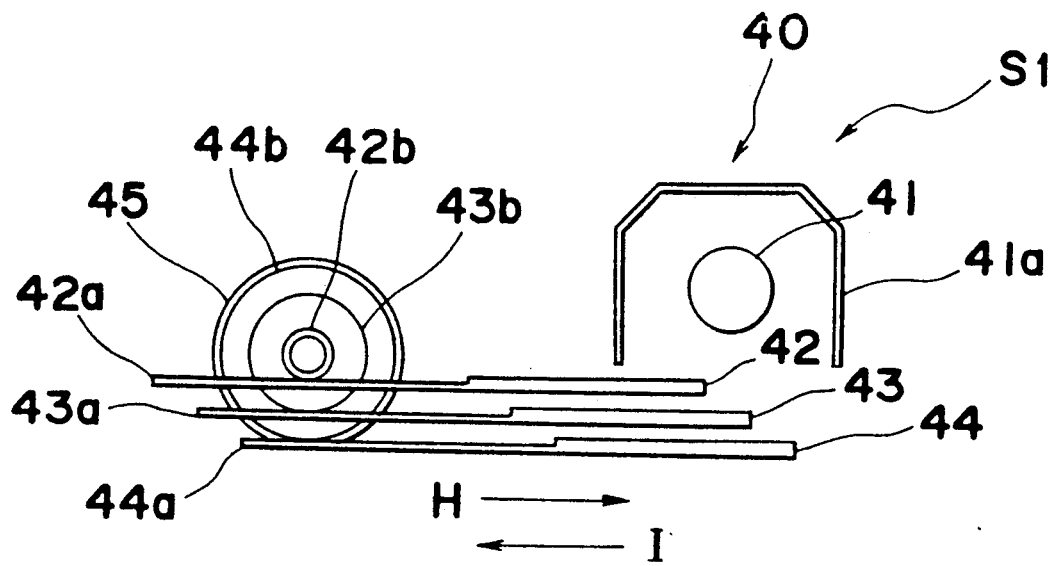
FIG. 1 is a schematic view of an auxiliary exposure device of a copying apparatus according to a first embodiment of the present invention.

Referring now to the drawings, there is shown in FIG. 3, a copying apparatus S1 which is an image forming apparatus according to a first embodiment of the present invention. The copying apparatus S1 includes an auxiliary exposure device 40 and an apparatus housing 1. A cassette 2 for accommodating a photoreceptive sheet 2a is provided at a right lower portion of the apparatus housing 1. The cassette 2 is detachably mounted on the apparatus housing 1. When the photoreceptive sheet 2a in the cassette 2 has been consumed, a front door (not shown) of the apparatus housing 1 is opened such that the old cassette 2 is replaced by a new cassette 2 containing a new photosensitive sheet 2a.

An end portion of the photoreceptive sheet 2a is discharged from a left lower portion of the apparatus housing 1 through a cutter 3, a sheet support 4, a pair of pressure rollers 5 and transport rollers 61, 62 and 63. At a left side of the apparatus housing 1, a paper feeding cassette 7 for accommodating a plurality of image receiving sheets is provided. The image receiving sheets are supplied from the paper feeding cassette 7 to the pressure rollers 5 so as to be discharged to a copy receiving tray 9 via a pair of heat rollers 8. An original platform 10 for placing an original document thereon is provided at an upper portion of the apparatus housing 1. An optical system 20 including a light source 11 for scanning the original document, mirrors 12a to 12d and a lens 18 is provided below the original platform 10. The optical system 20 scans the original document on the original platform 10 and guides reflected light (image forming exposure light) from the original document to the sheet support 4 so as to expose the photoreceptive sheet 2a.

The auxiliary exposure device 40 is provided above the sheet support 4. As shown in FIG. 1, the auxiliary exposure device 40 includes a plurality of tungsten lamps 41 acting as a light source lamp for emitting white light. The tungsten lamps 41 are arranged in a widthwise direction of the photoreceptive sheet 2a so as to be disposed in a frame 41a. Upon feed of the photoreceptive sheet 2a from the cassette 2, an upper face of the photoreceptive sheet 2a is uniformly exposed by the auxiliary exposure device 40. Three kinds of filters 42, 43 and 44 are provided below the frame 41a so as to reflect portions of light irradiated by the tungsten lamps 41. The filter 42 is a yellow (Y) filter for reflecting light having a wavelength range of blue (B), the filter 43 is a magenta (M) filter for reflecting light having a wavelength range of green (G) and the filter 44 is a cyan (C) filter for reflecting light having a wavelength range of red (R). In this embodiment, although the reflection type filters for reflecting light are employed, absorption type filters for absorbing light can be employed in place of the reflection type filters.

Figure 2:
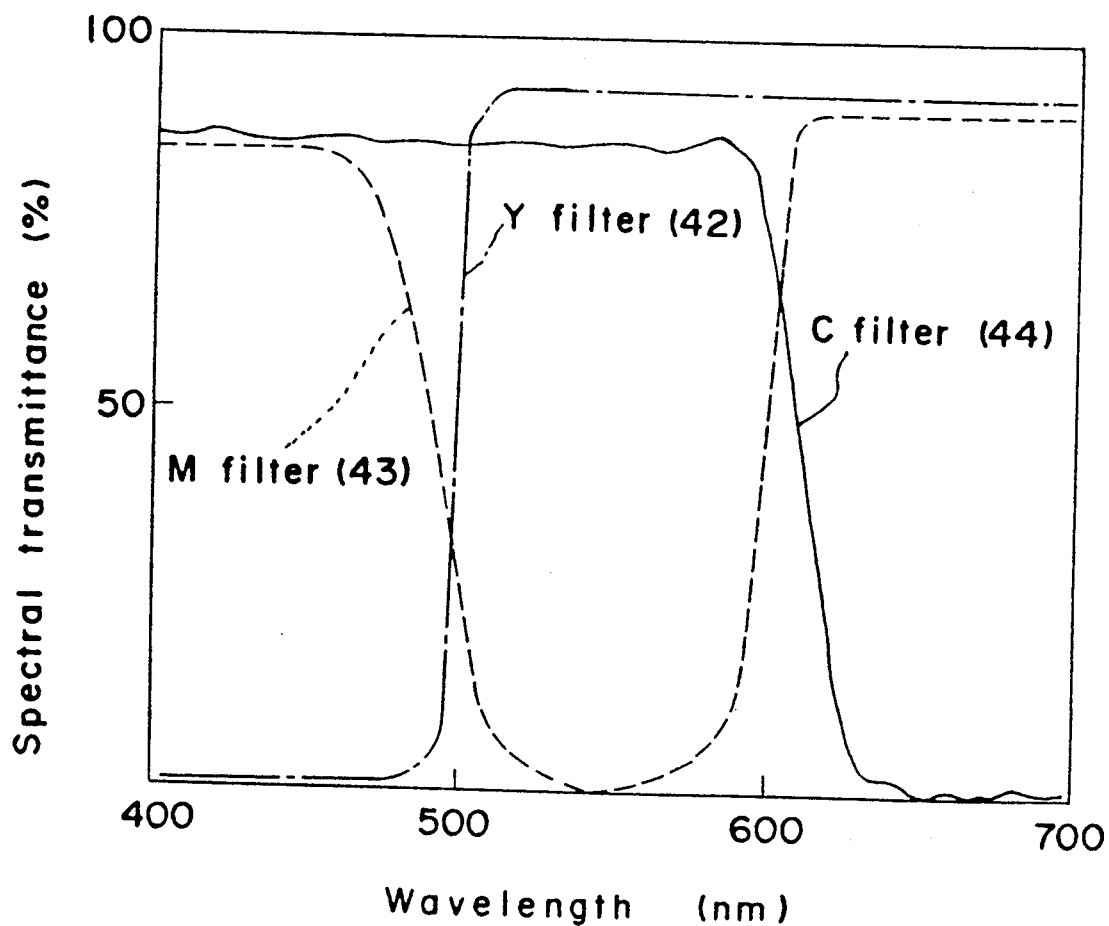
FIG. 2 is a graph showing spectral characteristics of filters employed in the auxiliary exposure device of FIG. 1.

FIG. 2 shows special transmissions of the Y, M and C 42, 43 and 44. The Y, M and C filters 42, 43 and 44 transmit 80 to 90% of light of yellow, light of magenta and light of cyan, respectively, and almost reflect blue light, green light and red light, respectively. Each of these filters 42, 43 and 44 is formed by, for example, a dichroic filter in which multilayered thin film coating is formed on a glass plate.

The Y, M and C filters 42, 43 and 44 have different widths extending perpendicularly to the plane of the sheet of FIG. 1 such that a lower one of the filters 42 to 44 has a wider width. Hence, the lowermost filter 44 has a maximum width. Each of racks 42a, 43a and 44a is formed at one end portion of each of the filters 42 to 44. Between gaps of width between adjacent ones of the filters 42 to 44, pinions 42b, 43b and 44b are provided so as be brought into mesh with the racks 42a, 43a and 44a, respectively. The pinions 42b, 43b and 44b are coupled with a stepping motor 45 through respective clutches. Thus, the filters 42 to 44 can be separately displaced through minute distances in directions of arrows H and I. When the filters 42 to 44 are displaced in the direction of the arrow H, areas of the tungsten lamps 41 covered by the filters 42 to 44 are increased and thus, the quantity of light reflected by each of the filters 42 to 44 increases. On the contrary, when the filters 42 to 44 are displaced in the direction of the arrow I, the areas of the tungsten lamps 42 covered by the filters 42 to 44 are reduced and thus, the quantity of light reflected by each of the filters 42 to 44 decreases. By changing ratios of the areas of the tungsten lamps 41 covered by the filters 42 to 44, it is possible to change spectral characteristics of light for exposing the photoreceptive sheet 2a. Namely, color correction of a formed image can be performed by controlling spectral characteristics of auxiliary exposure light.

Experiment 1

Figure 4A:
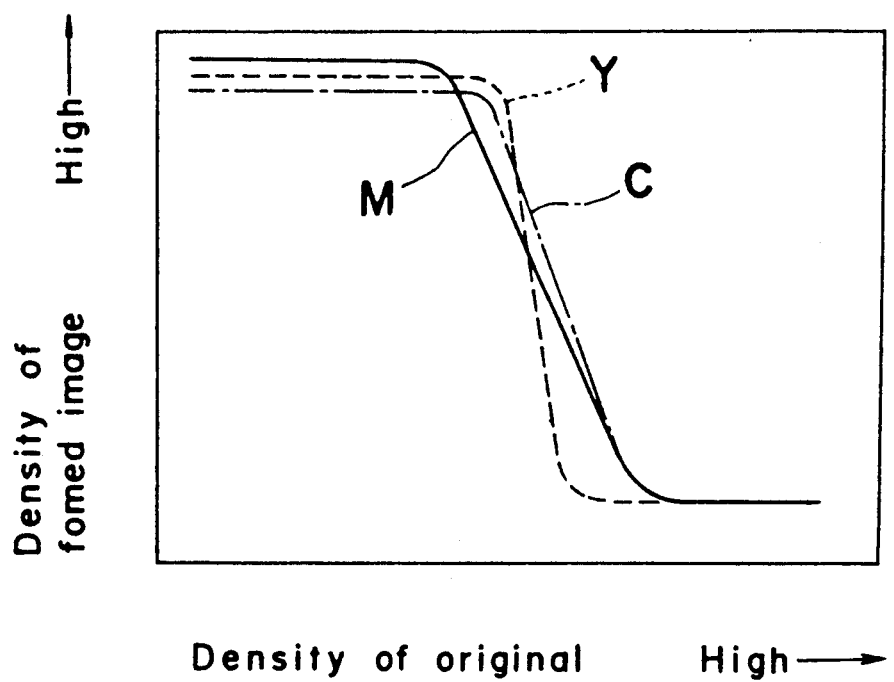
FIG. 4a is a graph showing density of an image formed without using the auxiliary exposure device of FIG. 1.

FIG. 4a shows densities of colors of yellow, magenta and cyan of a formed image in the case of copying of a gray scale without using the auxiliary exposure device 40 in a copying apparatus in which filters (not shown) for correcting spectral characteristics of image forming exposure light are provided in the course of the optical system 20. If an original document of a photograph is copied in this state, flesh color becomes yellowish or an image having partially improper colors is formed.

Figure 4B:
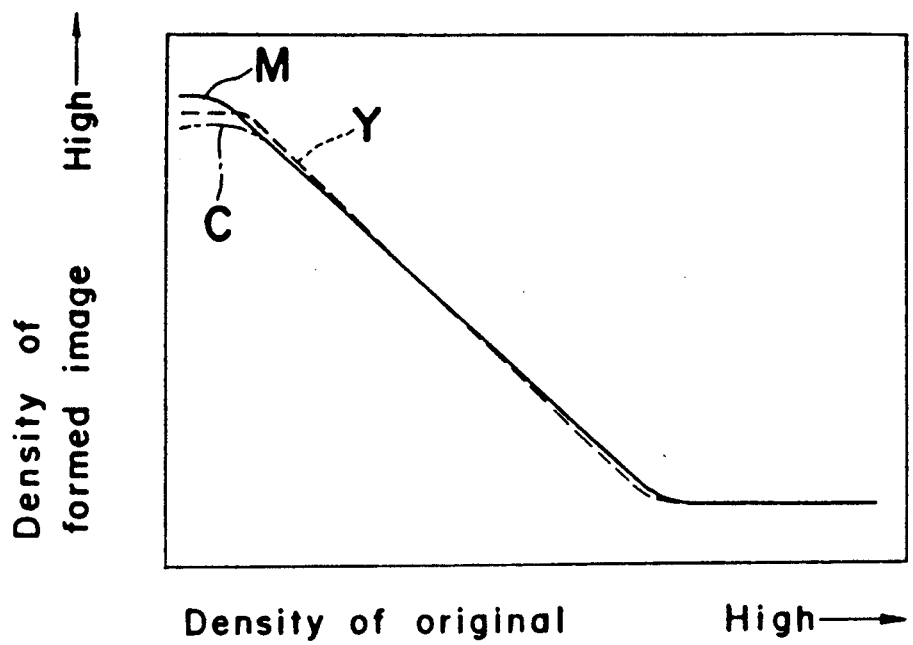
FIGS. 4b and 4c are graphs showing density of images formed by using the auxiliary exposure device of FIG. 1.

On the other hand, FIG. 4b shows densities of colors yellow, magenta and cyan of a formed image in the case of copying of the same gray scale as FIG. 4a by using the auxiliary exposure device 40. In FIG. 4b, ratios of areas of the tungsten lamps 41 covered by the Y, M and C filters 42, 43 and 44 are set at 42–10%, 43–30% and 44–45%, respectively. As a result, an excellent image having a gradational reproducibility of 9 gradations was obtained. Meanwhile, even when the original document of the photograph is copied, flesh color was excellently reproduced.

Experiment 2

Figure 4C:
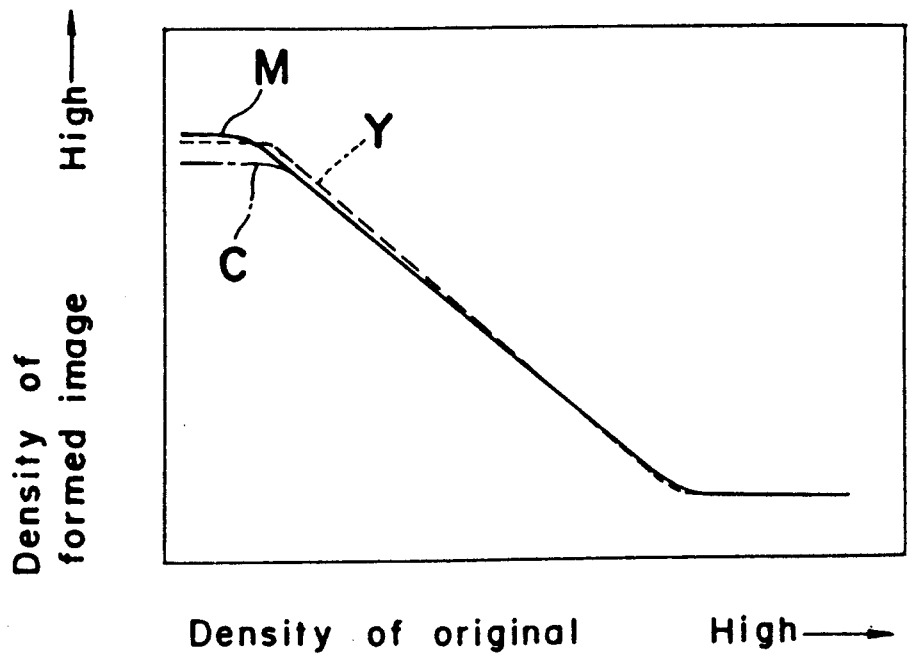

FIG. 4c shows densities of colors of yellow, magenta and cyan of a formed image in the case of copying of the same gray scale as the above experiment 1 by using the auxiliary exposure device 40 in a copying apparatus which is not provided with filters for correcting spectral characteristics of image forming exposure light. In FIG. 4c, ratios of areas of the tungsten lamps 41 covered by the Y, M and C filters 42, 43 and 44 are set at 42–5%, 43–20% and 25%, respectively. As a result, an excellent image having a gradational reproducibility of 9 gradations was obtained. In FIG. 4c, the maximum density of each of colors of yellow, magenta and cyan is slightly lower than that of FIG. 4b, the formed image has proper densities. Also in this experiment 2, if an original document of a photograph is copied, flesh color was excellently reproduced.

Meanwhile, the ratios of areas of the tungsten lamps 41 covered by the Y, M and C filters 42, 43 and 44 are determined by experiments but can be substantially obtained from the photosensitivity of each of the Y, M and C microcapsules, spectral characteristics of the tungsten lamps 41, or the like. The ratios of areas of the tungsten lamps 41 covered by the Y, M and C filters 42, 43 and 44 can be preliminarily stored in a microcomputer of the copying apparatus K1 in consideration of the kinds of photoreceptive sheet 2a to be used, the kinds of light source lamp to be used, etc. It can also be so arranged that the ratios of areas of the tungsten lamps 41 covered by the Y, M and C filters 42, 43 and 44 are obtained on the basis of other factors such as density of an original document, humidity, desired tone to be formed (for example, a reddish image is desired), and so on.

As is clear from the foregoing, in the copying apparatus K1 of the present invention, by changing the ratios of areas of coverage by the Y, M and C filters, of the tungsten lamps 41 for irradiating white light, an excellently formed image can be obtained through color correction. The auxiliary exposure device 40 of the copying apparatus K1 merely includes a single kind of the tungsten lamps 41, the filters 42, 43 and 44 for covering the tungsten lamps 41, the motor 45, and the pinions 42b, 43b and 44b. Therefore, in the copying apparatus of the present invention, the number of components is reduced in comparison with a known arrangement having the tungsten lamp for each filter, thereby resulting in a drop for its production cost. Although the tungsten lamps are employed as the light source for irradiating white light in this embodiment, the tungsten lamps can be replaced by halogen tungsten, lamps, xenon lamps, fluorescent lamps, or the like.

Meanwhile, in this embodiment, the Y, M and C filters are so provided as to be movable. However in the case where the kinds of photoreceptive sheet, or the kinds of light source lamp are not changed and spectral characteristics of auxiliary exposure light are not required to be changed in accordance with density of an original document, the ratios of areas of the tungsten lamps covered by the Y, M and C filters can be set at fixed values. In this case, the mechanism such as the stepping motor for driving the filters can be eliminated, so that the number of components can be reduced and thus, manufacturing costs can be lowered.

Furthermore, in this embodiment, three kinds of the Y, M and C filters are employed. However, in the present invention, the filters are not limited to the three kinds of the Y, M and C filters but other filters than the Y, M and C filters in number and color can be employed in consideration of characteristics of the photoreceptive sheet so as to absorb or reflect light of a wavelength range in which the photoreceptive sheet has effective photosensitivity.

In the image forming apparatus including the auxiliary exposure device, according to the present invention, since a plurality of kinds of light source lamps for irradiating white light, monochromatic light, etc. are not required to be provided for wavelength ranges of light, respectively, the number of kinds of light source lamps is reduced, so that the number of circuits for the light source lamps can be reduced and thus, the image forming apparatus can be manufactured at a low cost and can be simplified in structure. Furthermore, in accordance with the present invention, image quality can be improved through color correction.

Figure 7:
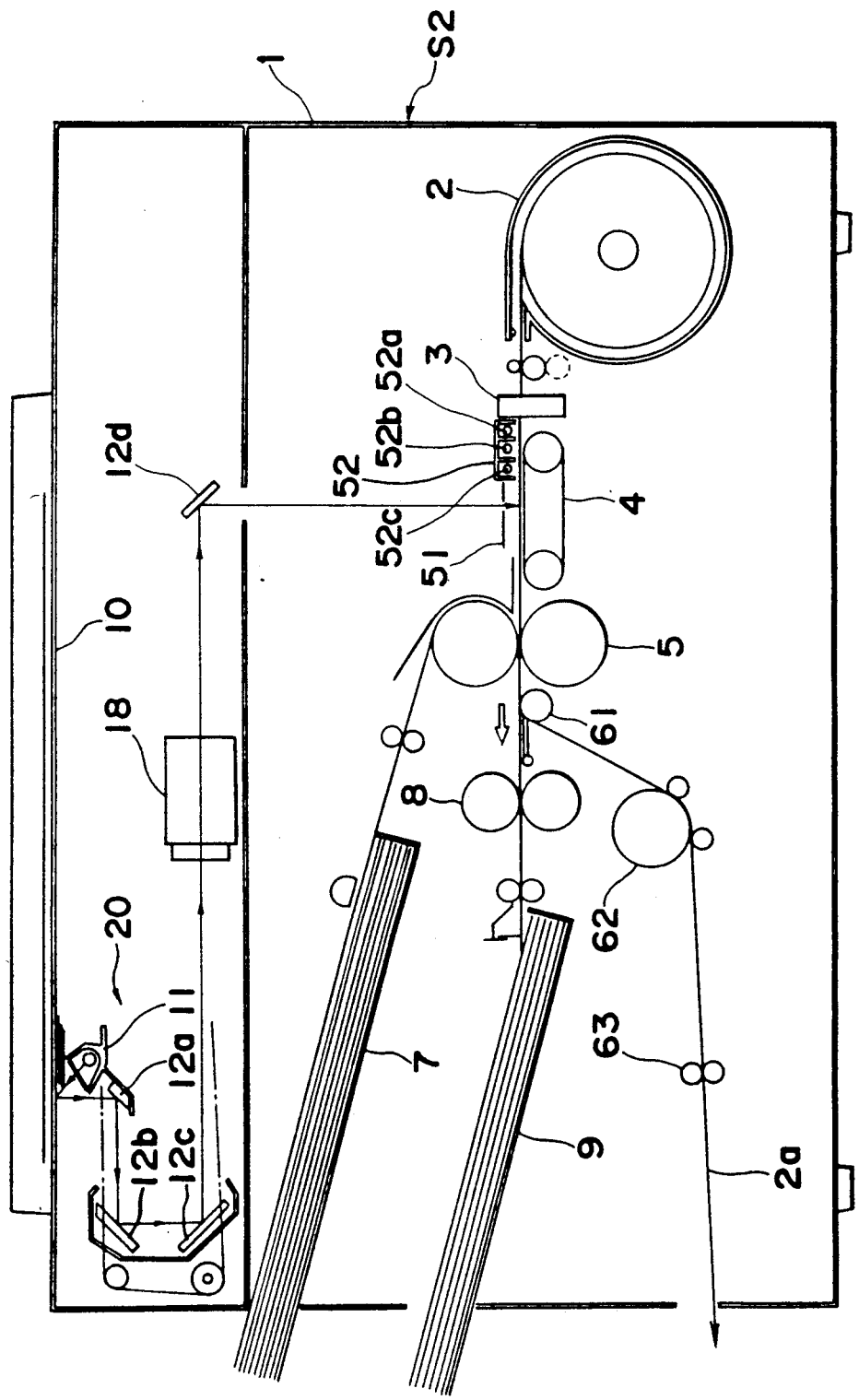
FIG. 7 is a schematic view of the copying apparatus of FIG. 5.

Referring to FIG. 7, there is shown a slit exposure type copying apparatus S2 which is an image forming apparatus according to a second embodiment of the present invention. In the copying apparatus S2, the optical system 20 guides reflected light (image forming exposure light) from the original document on the original platform 10, to the sheet support 4 through a slit 51 so as to expose the photoreceptive sheet 2a. The photosensitive sheet 2a accommodated in the cassette 2 is used for full-color purpose and has three kinds of photosensitive microcapsules, including Y capsules containing photo-setting material responsive to blue color and colorless dye for performing color development of yellow, M capsules containing photo-setting material responsive to green color and colorless dye for performing color development of magenta, and C capsules containing photo-setting material responsive to red color and colorless dye for performing color development of cyan. The photosensitive sheet 2a is obtained by coating the Y, M and C capsules on a base sheet made of polyester or the like such that the Y, M and C capsules are uniformly distributed on the base sheet.

The copying apparatus S2 includes an auxiliary exposure device 52 for correcting photo-setting characteristics, mainly gamma of the photoreceptive sheet 2a. Correction of gamma of the photoreceptive sheet is disclosed in unexamined Japanese Patent Laid-Open Publication No. 149343/1984 in which amount of oxygen in the photosensitive microcapsules of the photoreceptive sheet is reduced by performing auxiliary exposure such that gamma characteristics of the photosensitive sheet are improved. The auxiliary exposure device 52 includes a B light source 52a for irradiating blue light, a G light source 52b for irradiating green light and an R light source 52c for irradiating red light. The B, G and R light sources 52a, 52b and 52c are provided for correcting gammas of the Y, M and C capsules, respectively. Each of the B, G and R light sources 52a, 52b and 52c is constituted by, for example, a halogen tungsten lamp covered by filters for transmitting blue light, green light and red light, respectively. Alternatively, an LED or an EL panel can also be used as each of the B, G and R light sources 52a, 52b and 52c.

Figure 5:
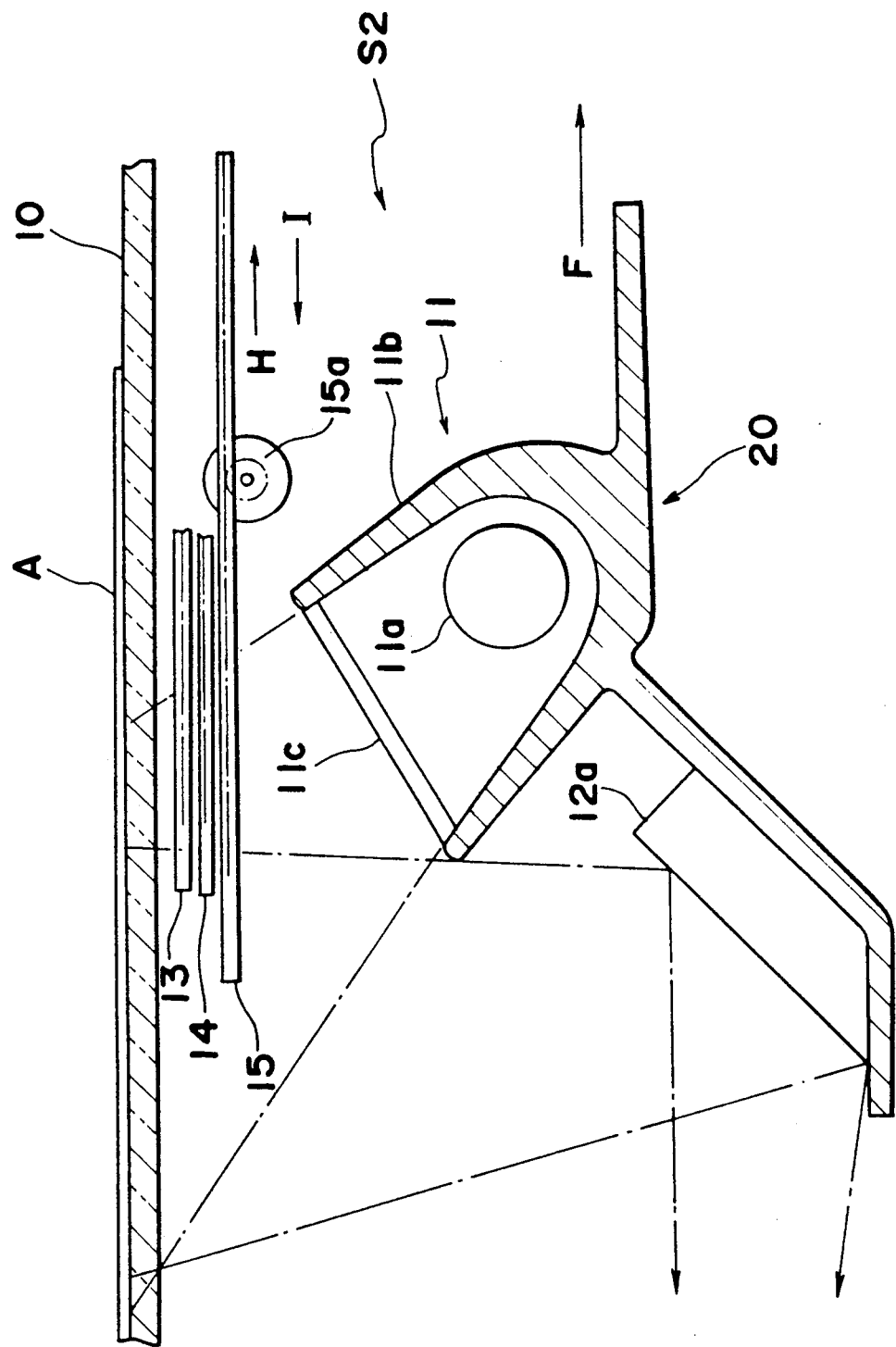
FIG. 5 is a sectional view of a filter mechanism of a copying apparatus according to a second embodiment of the present invention.

FIG. 5 shows a portion of the copying apparatus S2 in the vicinity of the light source 11 for scanning an original document A on the original platform 10. The light source 11 includes a linear type halogen tungsten lamp 11a. In order to perform scanning of the original document A efficiently, the halogen tungsten lamp 11a is provided in a reflector 11b. Since the reflector 11 has a parabolic cross-sectional shape, light of the halogen tungsten lamp 11a is irradiated, as substantially parallel light, onto the original document A on the original platform 10. The reflector 11b is covered by a filter 11c for absorbing near-infrared rays having a wavelength ranging from 0.8 to 2.5 μm. The filter 11c is made of phosphate glass or, the like. The filter 11c is provided for preventing a rise in temperature of the original platform 10, or the original document A. The light source 10 is displaced in the direction of the arrow F together with the first mirror 12a so as to scan the original document A.

Three kinds of filters 13, 14 and 15 are provided between the light source 11 and the original platform 10. The filters 13, 14 and 15 are used not only for correcting photo-setting characteristics, mainly sensitivity, but for imparting desired coloring of an operator to the formed image in response to input from an operating panel (not shown). The filters 13, 14 and 15 have characteristics shown in FIG. 2 and correspond to the Y, M and C filters 42, 43 and 44 of the copying apparatus S1, respectively. Namely, the Y filter 13 reflects blue light having a wavelength ranging from 400 to 500 nm, the M filter 14 reflects green light having a wavelength ranging from 500 to 600 nm and the C filter 15 reflects red light having a wavelength ranging from 600 to 700 nm. For example, a dichroic filter in which multilayered coating is performed on a glass plate is used as each of the filters 13, 14 and 15. These filters 13, 14 and 15 are provided in parallel with the linear type halogen tungsten lamp 11a so as to be displaced through minimum distances in the directions of the arrows H and I, namely horizontally and perpendicularly to a lengthwise direction of the slit 51. Each, of the filters 13, 14 and 15 is displaced by, for example, a stepping motor. For example, a rack is formed at a portion of the filter 15 and a pinion in mesh with the rack is mounted on a stepping motor 15a. Upon rotation of the stepping motor 15, the filter 15 is displaced through a minute distance in the direction of the arrow H or I. Although not specifically shown in FIG. 5, driving systems for driving the filters 13 and 14, which include stepping motors 13a and 14a, are coupled with the filters 13 and 14, respectively.

Figure 8:
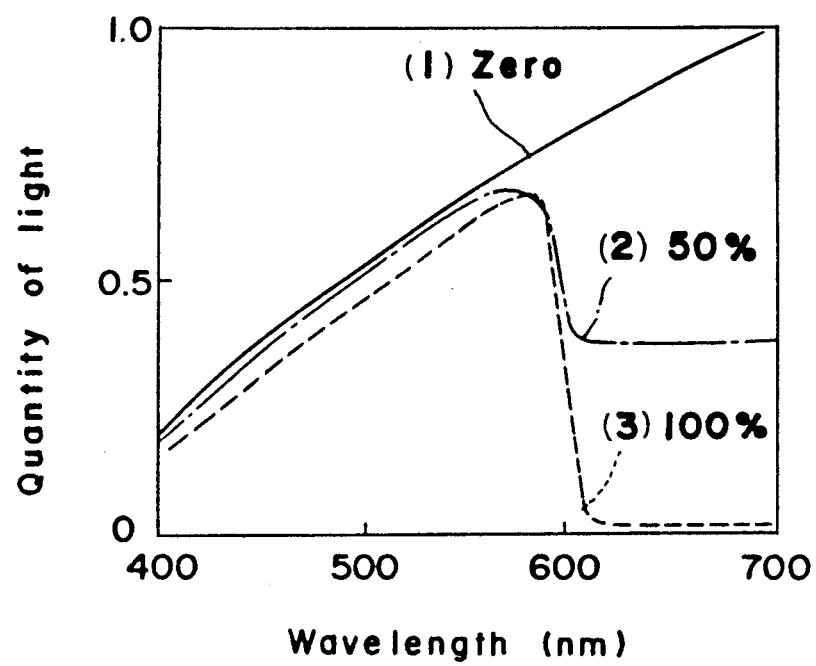
FIG. 8 is a graph showing relationship between an amount of displacement of a filter of the filter mechanism of FIG. 5 and a quality of light.

When the filters 13, 14 and 15 are displaced in the direction of the arrow H or I, ratios of areas of light of the light source 11 (image forming exposure light) intercepted by the filters 13, 14 and 15 change. Namely, when the filters 13, 14 and 15 are displaced in the direction of the arrow H, the ratios of areas of light of the light source 11 intercepted by the filters 13, 14 and 15 are reduced. On the contrary, when the filters 13, 14 and 15 are displaced in the direction of the arrow I, the ratios of areas of light of the light source 11 intercepted by the filters 13, 14 and 15 are increased. FIG. 8 shows relationship between the ratio of area of light of the light source 11 intercepted by the C filter 15 and a quantity of light. In FIG. 8, a curve (1) represents a case in which the ratio of area of light of the light source 11 intercepted by the C filter 15 is zero, namely the C filter 15 is not inserted into light of the light source 11. Furthermore, a curve (2) represents a case in which the C filter is inserted into light of the light source 11 such that the ratio of area of light of the light source 11 intercepted by the filter 15 is 50% and a curve (3) represents a case in which the C filter 15 is inserted into light of the light source 11 such that the ratio of area of light of the light source 11 intercepted by the filter 15 is 100%. It is seen from FIG. 8 that red light having a wavelength ranging from 600 to 700 nm is reflected approximately in proportion to the ratio of area of the light source 11 intercepted by the C filter 15 such that light of the light source 11, in which quantity of red light is reduced, scans the original document A. Therefore, if the original document A is scanned by such light of the light source 11, reflected light from the original document A has a small amount of red light, so that the C capsules photosensitive to red light is less likely to be set and thus, the formed image is tinged with color of cyan.

By changing the ratios of areas of light of the light source 11 intercepted by the filters 13, 14 and 15, the quantity of light (light having a specific wavelength range) reflected by each of the filters 13, 14 and 15 can be adjusted in a stepless manner. Namely, the quantity of blue light, the quantity of green light and the quantity of red light in image forming exposure light can be changed in a stepless manner. Thus, setting ratios of the Y, M and C capsules are adjusted by a combination of quantities of blue light, green light and red light such that colors and densities of the colors in the formed image can be changed variously changed. Meanwhile, at portions where light of the light source 11 is not intercepted by the filters 13, 14 and 15, light of the light source 11 is not reflected by the filters 13, 14 and 15 and thus, loss of quantity of light can be minimized. Furthermore, since the filters 13, 14 and 15 can be displaced in the directions of the arrows H and I, i.e. horizontally and perpendicularly to the lengthwise direction of the slit 51, such a phenomenon does not take place that the copied image has non-uniform colors partially in the lengthwise direction of the slit 51.

Meanwhile, in the second embodiment, the Y, M and C filters 13, 14 and 15 for reflecting blue light, green light and red light are employed but can be replaced by filters for absorbing blue light, green light and red light. Furthermore, the Y, M and C filters 13, 14 and 15 can be replaced by B, G and R filters for absorbing or reflecting light of yellow (Y), light of magenta (M) and light of cyan (C), respectively. However, in this case, such a drawback is incurred that loss of quantity of light is great. In addition to the dichroic filter, each of the filters 13, 14 and 15 can be formed by a colored polyethylene terephthalate filter, a gelatin filter, or the like. Moreover, in the second embodiment since the filters 13, 14 and 15 are inserted into the path of the light source 11 before the light source 11 is irradiated onto the original document A, the filters 13, 14 and 15 are not required to be manufactured so accurately and thus, can be manufactured at a low cost.

Figure 6:
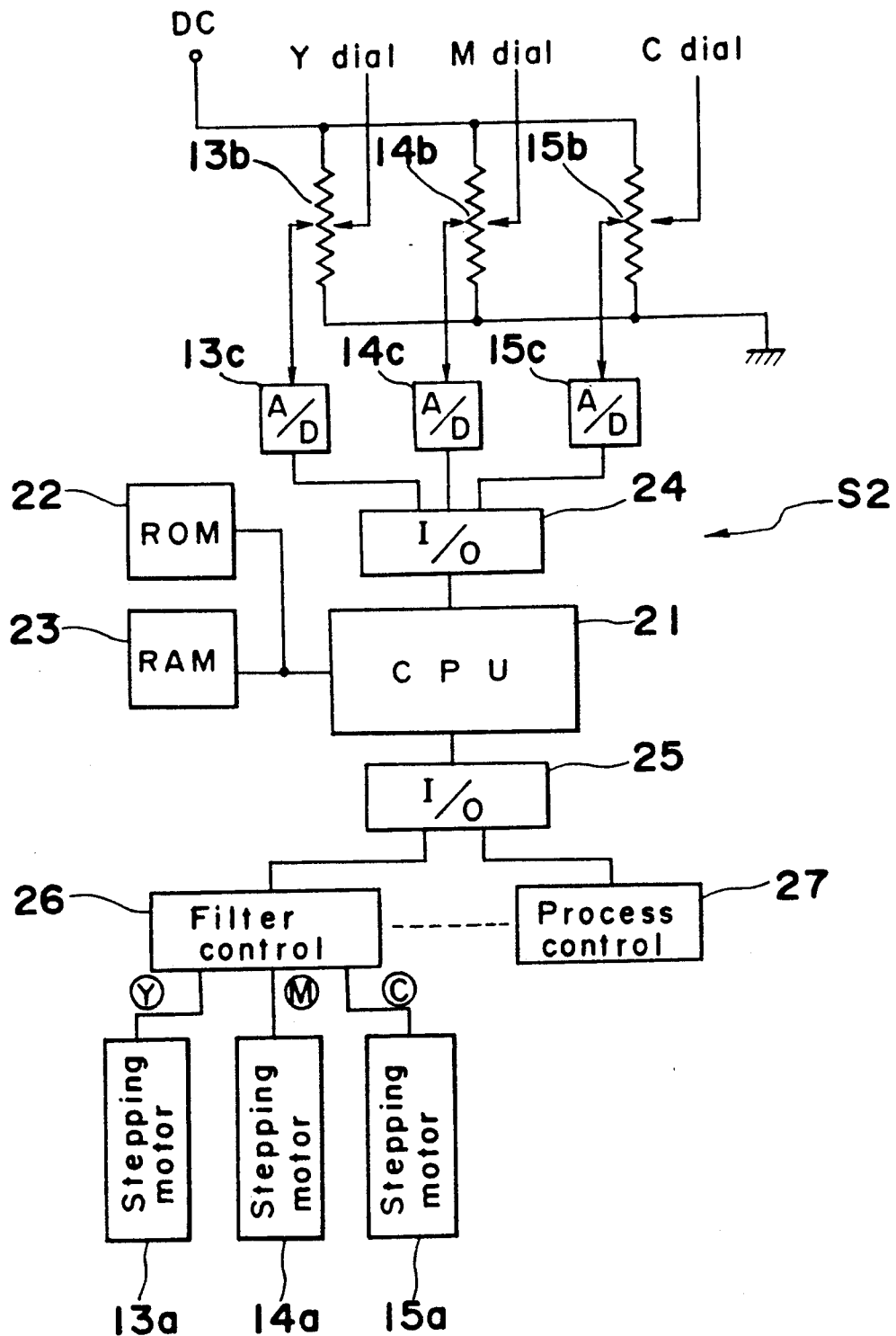
FIG. 6 is a block diagram of the copying apparatus of FIG. 5.

FIG. 6 shows a control portion of the copying apparatus S2. The control portion includes a CPU 21 for controlling the copying apparatus S2 as a whole. A control program is preliminarily stored in a ROM 22. At the time of execution of the control program, a RAM 23 is used as a working area. Meanwhile, the operating panel (not shown) is provided at an upper portion of the apparatus housing 1. In this operating panel, Y, M and C color adjusting dials for adjusting colors of yellow, magenta and cyan are provided. When the Y, M and C color adjusting dials have been rotated, resistances of variable resistors 13b, 14b and 15c connected to the Y, M and C color adjusting dials are, respectively, changed and are read so as to be digitalized by A-D converters 13c, 14c and 15c. The digitalized resistances of the variable resistors 13b, 14b and 15b are inputted to the CPU 21 through an I/O unit 24. On the basis of the data inputted to the CPU 21, the CPU 21 calculates, as data of the ratios of areas of light of the light source 11 intercepted by the Y, M and C filters 13, 14 and 15, the numbers of pulses corresponding to quantities of rotations of the stepping motors 13a, 14a and 15a. Conversion factors for effecting conversion between the numbers of pulses and the ratios of areas of light of the light source 11 intercepted by the filters 13, 14 and 15 are beforehand stored in the ROM 22. The data of the ratios of areas are outputted from the CPU 21 to a filter control portion 26 through an I/O unit 25. Meanwhile, data of process control are outputted from the CPU 21 to a process control portion 27 through the I/O unit 25.

In the filter control portion 26, the stepping motors 13a, 14a and 15a are driven based on the data of the ratios of areas so as to displace the filters 13, 14 and 15 in the directions of the arrow H or I. For example, data that "red color should be emphasized" has been inputted from the color adjusting dials, an arithmetic operation is performed in the CPU 21 such that the ratios of areas for the Y and M filters 13 and 14 are increased but the ratio of area for the C filter 15 is reduced. Thus, the Y and M filters 13 and 14 are displaced in the direction of the arrow I, while the C filter 15 is displaced in the direction of the arrow H, so that the quantity of red light is increased. Therefore, the C capsules are readily set and thus, the formed image becomes reddish through weakening of the color of cyan.

Figure 9:
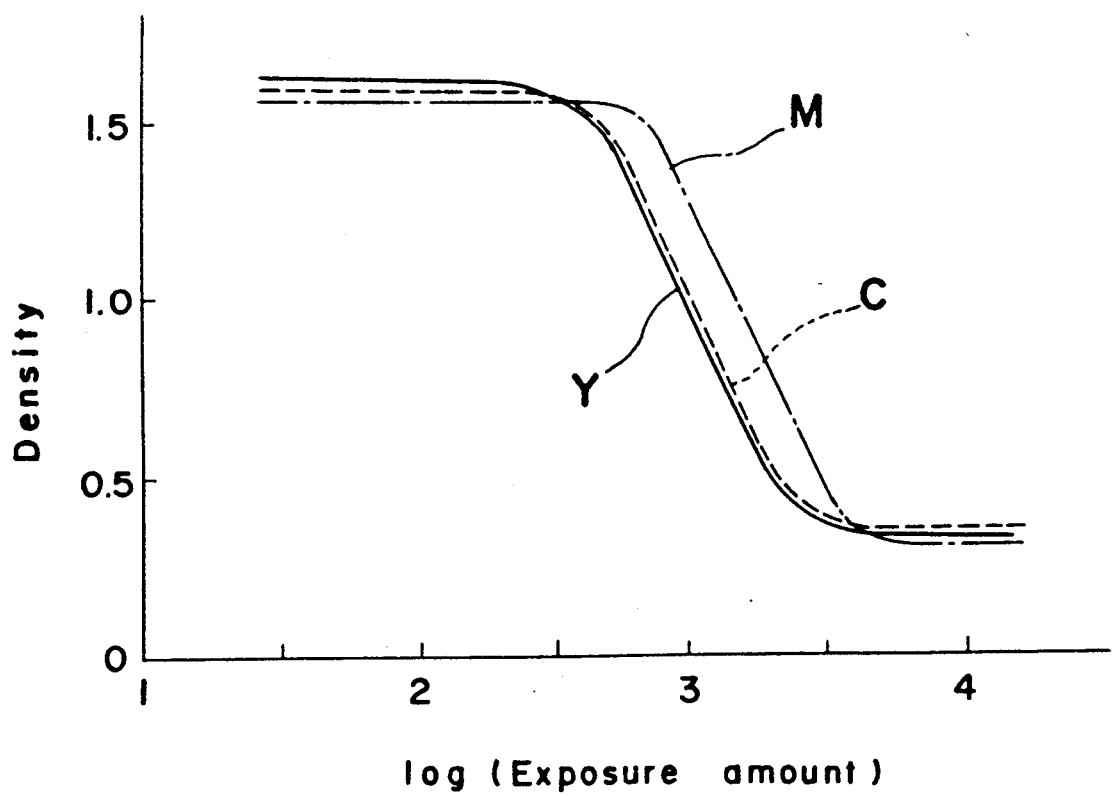
FIG. 9 is a graph showing photo-setting characteristics of a photoreceptive sheet employed in the copying apparatus of FIG. 5.

By using the copying apparatus S2 of the above described arrangement, copying experiments were performed. Initially, in order to obtain photo-setting characteristics of the photoreceptive sheet 2a, a gray scale having a density ranging from 0.05 to 1.85 at a pitch of 0.1 was copied without using the filters 13, 14 and 15 and densities of colors of yellow, magenta and cyan of the formed image were measured. FIG. 9 shows results of this copying. In FIG. 9, the ordinate represents the density of the gray scale and the abscissa represents the exposure amount. It will be seen from FIG. 9 regarding photo-setting characteristics of the photoreceptive sheet 2a that the Y, M and C capsules have a substantially identical gamma (slope) but sensitivity of the M capsules is lower than those of the Y and C capsules approximately by a density of 0.6 and thus, the formed image becomes reddish and bluish. At this time, the halogen tungsten lamp 11a has an electric power of 600 W and a scanning speed is 5.0 mm/sec.

Then, the gray scale was copied by using the copying apparatus S2. As described above, sensitivity of the M capsules of the photoreceptive sheet 2a is especially low. Therefore, in order to correct sensitivity of the M capsules by the filters 13, 14 and 15, a quantity of green light is relatively increased. Hence, the ratios of areas of light of the light source 11 intercepted by the Y, M and C filters 13, 14 and 15 are, respectively, set at 30%, 0% and 25% and the electric power of the light source 11 and the scanning speed are set such that the characteristic curves of colors of yellow and cyan coincide with that of color of magenta in FIG. 9. As a result, at a scanning speed of 5.0 mm/sec., an excellent image having neutral gray color free from specific coloring was obtained when the electric power of the light source 11 is set at 690 W. Meanwhile, if the electric power of the light source 11 is set at 600 W, an excellent image identical with the above one was obtained at a scanning speed of 4.3 mm/sec.

As a comparative example, copying experiments of the same gray scale as described above were performed by using a known copying apparatus employing 15 filters. At this time, Y and C filters for absorbing blue light and red light in a quantity corresponding to a density of 0.6 are inserted into light of the light source and the electric power of the light source and the scanning speed are set such that the characteristic curves of colors of yellow and cyan coincide with that of color of magenta in FIG. 9. As a result, at a scanning speed of 5.0 mm/sec., 880 W was required for the electric power of the light source. Meanwhile, if the electric power of the light source is set at 600 W, the scanning speed was required to be reduced to 3.4 mm/sec.

As will be seen from the foregoing description, if the scanning speed is fixed at 5.0 mm/sec., the electric power of the light source 11 of the copying apparatus S2 can be reduced by 190 W (=880−690) as compared with the known copying apparatus. Meanwhile, if the electric power of the light source is fixed at 600 W, operating time of the copying apparatus S2 can be reduced by 0.9 mm/sec. (=4.3−3.4) as compared with the known copying apparatus, which means that a time period of about 19 sec. can be saved in the case of A4-sized copying.

Meanwhile, if copying is performed by the copying apparatus S2 on the same conditions as the known copying apparatus, i.e. at an electric power of the light source of 80 W and a scanning speed of 5.0 mm/sec., a bright copied image can be obtained. Thus, since photo-setting characteristics, mainly sensitivity of the photoreceptive sheet 2a are corrected by using the filters 13, 14 and 15, an excellent image can be obtained. The ratios of areas of light of the light source 11 intercepted by the filters 13, 14 and 15 are determined based on photo-setting characteristics of the photoreceptive sheet 2a and are stored in the ROM 22 preliminarily. If the ratios of areas of light of the light source 11 intercepted by the filters 13, 14 and 15 are changed, gamma of photo-setting characteristics can also be changed in addition to sensitivity.

Meanwhile, data regarding specific colors desired by the operator and densities of the colors are inputted from the Y, M and C color adjusting dials. In accordance with these data as well as the above described photo-setting characteristics of the photoreceptive sheet 2a, the CPU 21 calculates data of the ratios of areas of light of the light source 11 intercepted by the filters 13, 14 and 15. The thus obtained ratios of areas of light of the light source 1 intercepted by the filters 13, 14 and 15 are outputted to the filter control portion 26 so as to control the stepping motors 13a, 14a and 15a, respectively. Therefore, by simply rotating the color adjusting dials, coloring of the copied image can be adjusted easily and thus, various colors can be imparted to the formed image.

Meanwhile, in the second embodiment of the present invention, the stepping motors 13a, 14a and 15a are employed for driving the filters 13, 14 and 15, respectively. However, if the filters 13, 14 and 15 are arranged to be displaced manually, the copying apparatus S2 is simplified, thereby resulting in drop of its manufacturing cost. Meanwhile, the filters 13, 14 and 15 can be provided at any location in the course of image forming exposure light and thus, may be provided, for example, at a position upstream or downstream of the lens 18 of the optical system 20 as will be described later.

Furthermore, in the second embodiment of the present invention, the photoreceptive sheet 2a for full-color purpose is employed and the Y, M and C filters 13, 14 and 15 and the B, G and R light sources 52a, 52b and 52c corresponding to the Y, M and C capsules are provided. However, the number and kinds of the filters and of the light sources of the auxiliary exposure device can be selected according to the kinds of photoreceptive sheet 2a. For example, in the case where the photoreceptive sheet 2a is obtained by coating photosensitive microcapsules responsive to ultraviolet rays, filters for absorbing or reflecting ultraviolet rays and an auxiliary exposure device for irradiating ultraviolet rays are employed. Meanwhile, in the second embodiment of the present invention, the copying apparatus may be of an electrophotographic type.

In the image forming apparatus according to the second embodiment of the present invention, by changing minute displacement distances of the filters for reflecting or absorbing light having specific wavelength ranges, the quantity of light having specific wavelength ranges to be reflected or absorbed by the filters can be changed in a stepless manner. Therefore, in accordance with the present invention, densities of the image formed by light having specific wavelength ranges can be changed in a stepless manner. Namely, since a number of filters corresponding to densities and a mechanism for driving the filters are not required to be provided, the image forming apparatus can be simplified in structure and thus, its manufacturing cost can be lowered.

Figure 10:
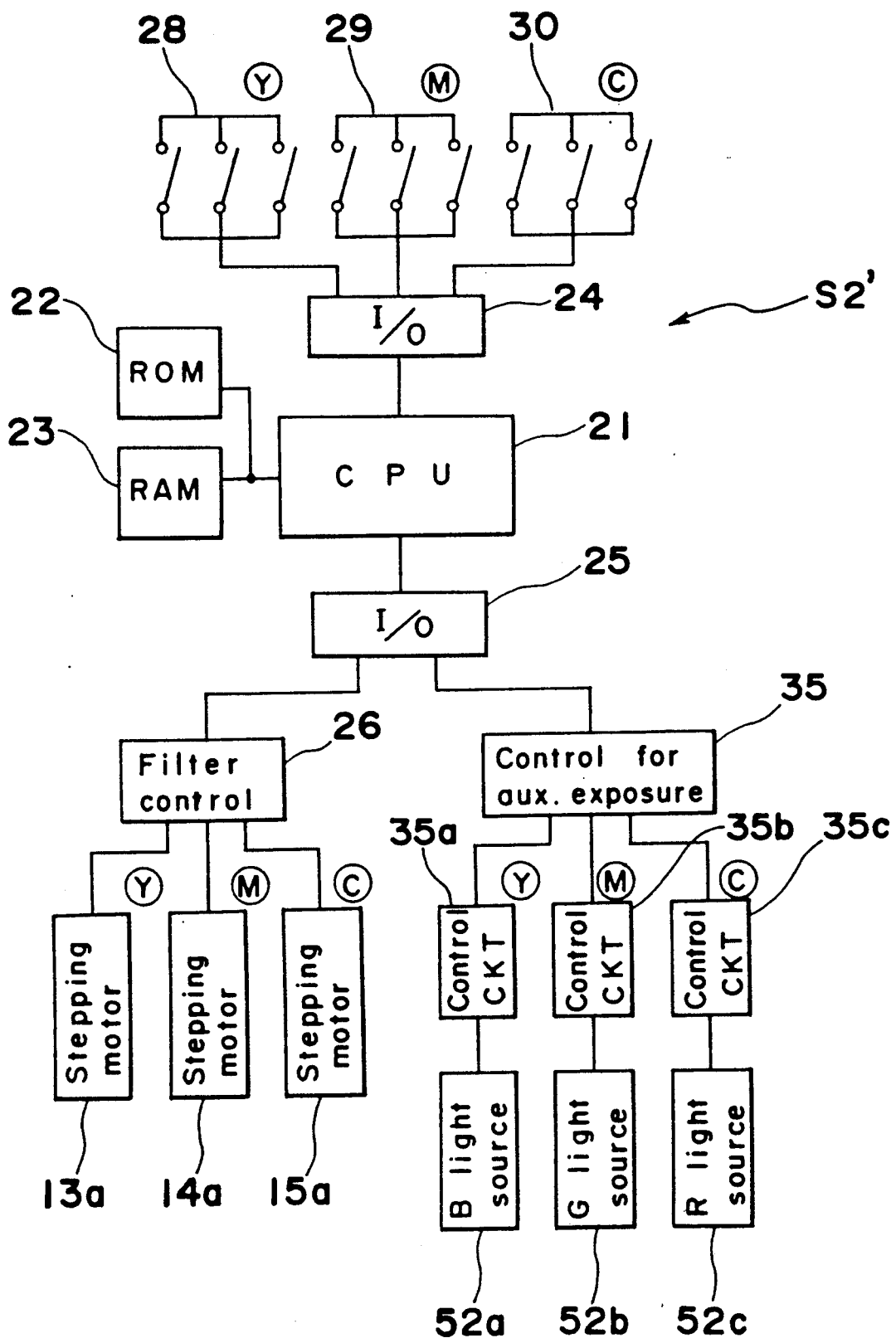
FIG. 10 is a view similar to FIG. 6, particularly showing a first modification of the copying apparatus of FIG. 5.

FIG. 10 shows a control portion of a copying apparatus S2' which is a first modification of the copying apparatus S2. In the apparatus housing 1, dip switches 28, 9 and 30 are provided. The dip switches 28, 29 and 30 correspond to photo-setting characteristics of the Y, M and C capsules, respectively and are each constituted by three switches. Namely, by using each of the dip switches 28, 29 and 30, eight kinds of characteristic states can be set for each of the Y, M and C capsules. Commands for turning on and off the switches of the dip switches 28, 29 and 30 are indicated on the photoreceptive sheet 2a. At the time of replacement of the photoreceptive sheet 2a, the operator sets turning on and off of the switches of the dip switches 28, 29 and 30 in accordance with the indication on the photoreceptive sheet 2a and thus, characteristic data contained in the photoreceptive sheet 2a are inputted, through the I/O unit 24, to the CPU 21. On the basis of the characteristic data inputted to the CPU 21, the CPU 21 sets the numbers of pulses corresponding to quantities of rotations of the stepping motors 13a, 14a and 15a, as data of the ratios of areas of light of the light source 11 intercepted by the Y, M and C filters 13, 14 and 15, respectively and sets quantities of light of the B, G and R light sources 52a, 52b and 52c of the auxiliary exposure device 52, as data of quantities of auxiliary exposure light, respectively. The data of the ratios of areas are outputted from the CPU 21 to the filter control portion 26 through the I/O unit 25. Meanwhile, the data of quantities of auxiliary exposure light are outputted from the CPU 21, via the I/O unit 25, to a control portion 35 for controlling the auxiliary exposure device 52. The control portion 35 controls control circuits 35a, 35b and 35c for the B, G and R light sources 52a, 52b and 52c, respectively such that the photoreceptive sheet 2a is subjected to auxiliary exposure at predetermined quantities of light. Setting of the quantities of light of the B, G and R light sources 52a, 52b and 52c are determined by voltages or duty ratios of the B, G and R light sources 52a, 52b and 52c, etc.

In the copying apparatus S2', sensitivities of the Y, M and C capsules are inspected for each production lot of the photoreceptive sheet 2a and are indicated on the photoreceptive sheet 2a. By operating the dip switches 28, 29 and 30 in accordance with the indication on the photoreceptive sheet 2a, the operator sets positions of the filters 13, 14 and 15 on the basis of the conversion factors stored in the ROM 22 so as to perform proper sensitivity correction corresponding to the photoreceptive sheet 2a.

Figure 11:
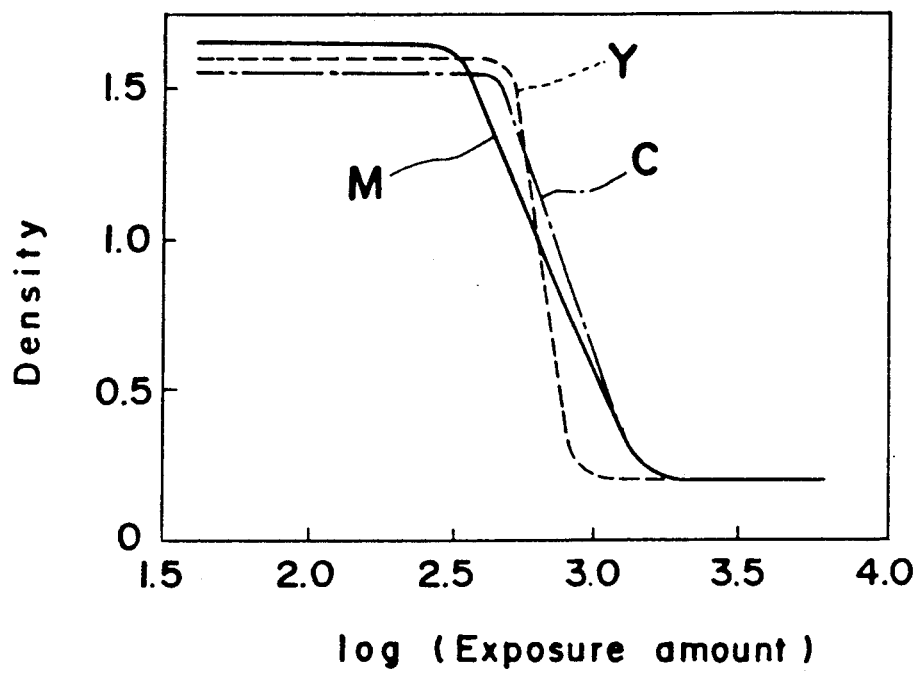
FIG. 11 is a graph showing photo-setting characteristics of a photoreceptive sheet employed in the copying apparatus of FIG. 10.

Then, correction of gamma in the copying apparatus S2' is described. For example, another photoreceptive sheet 2a for full-color purpose has photo-setting characteristics shown in FIG. 11. In FIG. 11, the gray scale having a density ranging from 0.05 to 1.85 at a pitch of 0.1 was copied without using the filters 13, 14 and 15 and the auxiliary exposure device 52 and densities of yellow, magenta and cyan of the formed image were measured as in FIG. 9. Thus, the ordinate represents the density of the gray scale and the abscissa represents the exposure amount. Regarding photo-setting characteristics of this photoreceptive sheet 2a, the Y, M and C capsules have a substantially identical sensitivity, while the gamma of each of the Y, M and C capsules is large and the formed image of the gray scale has 4 gradations. Therefore, if image forming is performed by using such a photoreceptive sheet 2, the formed image has a higher contrast and therefore, this photoreceptive sheet 2a is not suitable for copying of an original document having medium tone, for example, a photograph.

Figure 12:
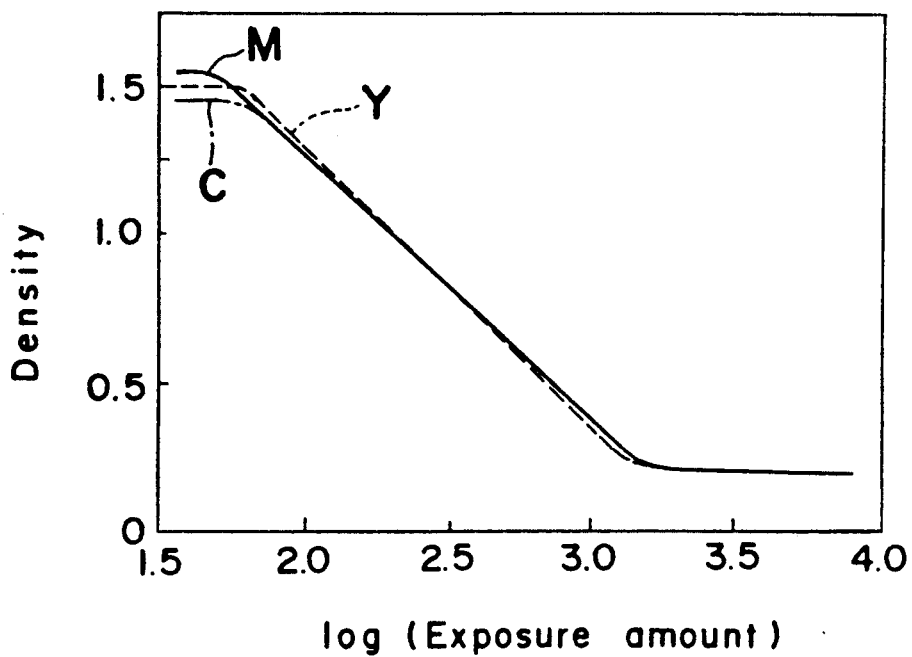
FIG. 12 is a graph similar to FIG. 11, particularly showing correction of gamma of the photoreceptive sheet of FIG. 11.

Then, the above mentioned gray scale was copied through auxiliary exposure by setting voltages of the B, G and R light sources 52a, 52b and 52c of the auxiliary exposure device 52 at 10.3 V, 3.0 V and 7.0 V, respectively. As a result, the copied image has 6 gradations and enables reproduction of medium tone. Furthermore, when the gray scale referred to above was copied through auxiliary exposure by setting voltages of the B, G and R light sources 52a, 52b and 52c at 12.0 V, 6.0 V and 8.2 V, respectively, an excellent copied image having 9 gradations was obtained. FIG. 12 shows the relationship between an exposure amount (density of the gray scale) and the density of the formed image at this time. It will be understood from FIG. 12 that the gamma (slope) of the photoreceptive sheet 2a is improved as compared with FIG. 11.

By setting voltages of the B, G and R light sources 52a, 52b and 52c of the auxiliary exposure device 52 as described above, the gamma of the photoreceptive sheet 2a is improved and an excellent copied image can be obtained. In the same manner as earlier mentioned sensitivity characteristics of the photoreceptive sheet, and, gamma characteristics of the photoreceptive sheet are inspected for each production lot of the photoreceptive sheet and are indicated on the photoreceptive sheet. By operating the dip switches 28, 29 and 30 in accordance with the indication on the photoreceptive sheet 2a, the operator sets voltages (quantity of light) of the B, G and R light sources on the basis of the conversion factors stored in the ROM 22 so as to perform proper gamma correction corresponding to the photoreceptive sheet.

In the copying apparatus S2', sensitivity of the photoreceptive sheet 2a is corrected by the filters 13, 14 and 15, while the gamma of the photoreceptive sheet 2a is corrected by the auxiliary exposure device 52. However, it can also be so arranged that the gamma of the photoreceptive sheet 2a is corrected by the filters 13, 14 and 15 and sensitivity of the photoreceptive sheet 2a is corrected by the auxiliary exposure device 52.

Meanwhile, in the copying apparatus S2', the three dip switches 28, 29 and 30 capable of inputting 8 kinds of photo-setting characteristics are provided. The number of dip switches is not restricted to three but can be set to an arbitrary value. In addition to the dip switches photo-setting characteristics of the photoreceptive sheet 2a can be inputted from keys. Meanwhile, it can also be so arranged that photo-setting characteristics of the photoreceptive sheet 2a are recorded on the cassette 2 by using a magnetic tape, a bar code, or the like, and a reader for reading data of photo-setting characteristics is provided at the apparatus housing 1 such that the data of photo-setting characteristics are directly read by the reader by mounting the cassette 2 on the apparatus housing 1. At this time, the operator is relieved of the burden of inputting the data of photo-setting characteristics and errors from input of the data of photo-setting characteristics can be eliminated.

In the copying apparatus S2', photo-setting characteristics of the image formed by light having specific wavelength ranges can be changed in a stepless manner. The displacement distances of the filters are set based on photo-setting characteristics of the photoreceptive sheet inputted by the dip switches and photo-setting characteristics corresponding to each production lot of the photoreceptive sheet are inputted, so that photo-setting characteristics of the formed image are corrected by the filters and thus, an excellent image is obtained.

Figure 14:
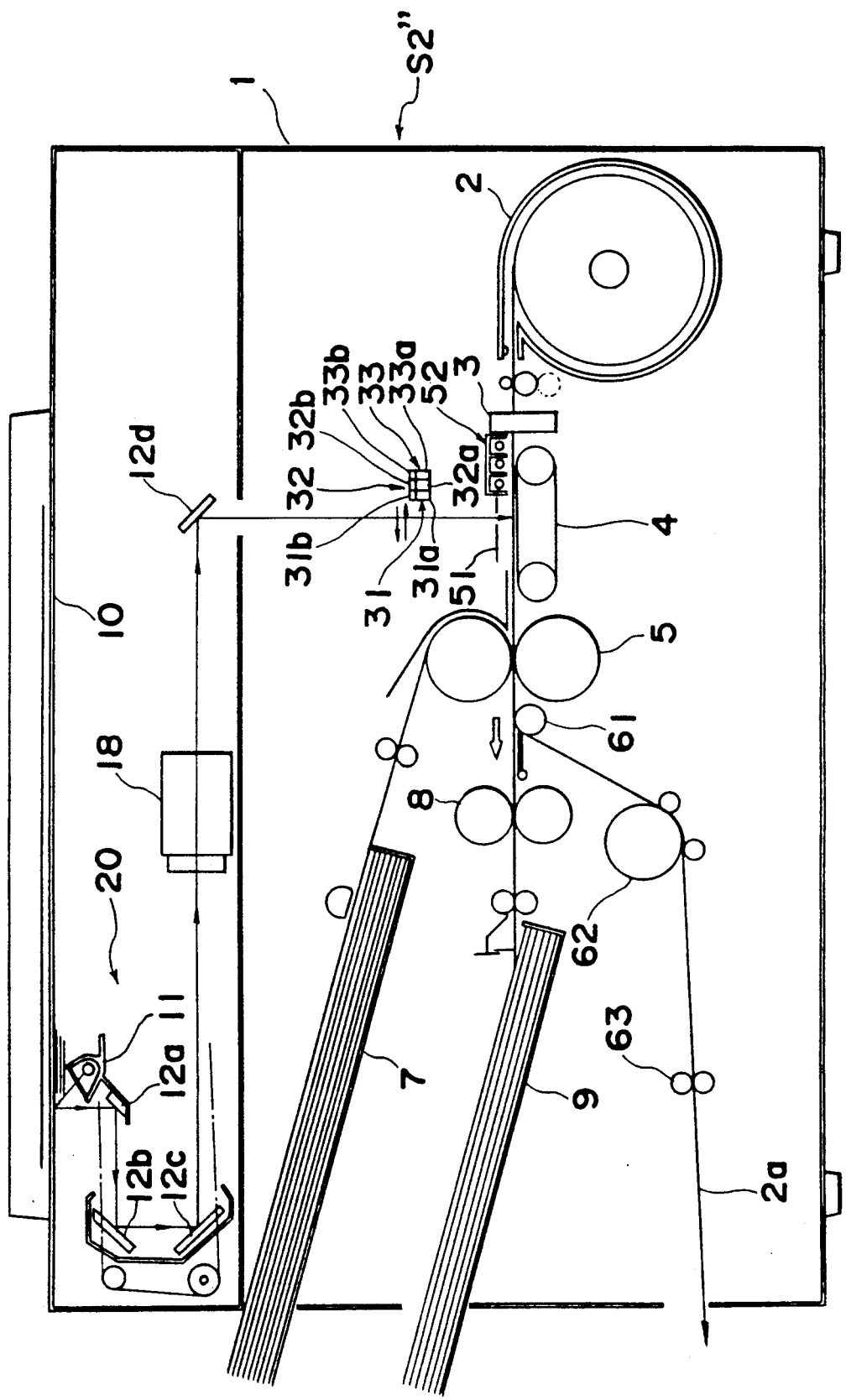
FIG. 14 is a schematic view of the copying apparatus of FIG. 13.

Referring to FIG. 14, there is shown a copying apparatus S2'' which is a second modification of the copying apparatus S2. In the copying apparatus S2'', density sensors 31, 32 and 33 for detecting density of the original document are provided above the sheet support 4. The density sensor 31 is constituted by a silicon photosensor 31a and a color separation filter 31b placed on the silicon photosensor 31a. Likewise, the density sensor 32 is constituted by a silicon photosensor 32a and a color separation filter 32b placed on the silicon photosensor 32a, while the density sensor 33 is constituted by a silicon photosensor 33a and a color separation filter 33b placed on the silicon photosensor 33a. A dichroic filter in which, for example, multilayered coating is performed on a colored glass is used as each of the color separation filters 31b, 32b and 33b.

Figure 15:
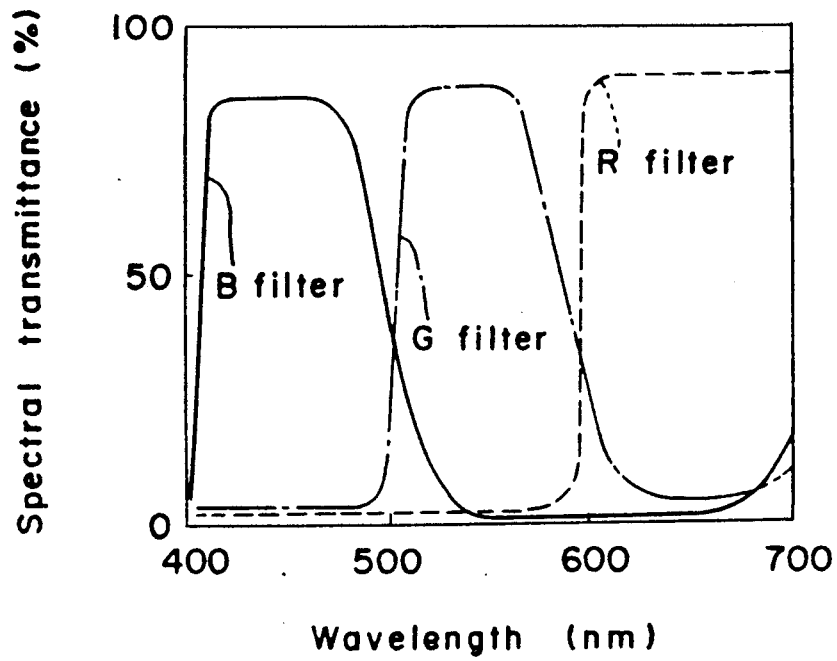
FIG. 15 is a graph showing transmissions of color separation filters of density sensors employed in the copying apparatus of FIG. 13.

FIG. 15 shows respective spectral transmissions of the color separation filters 31b, 32b and 33b. The color separation filters 31b, 32b and 33b transmit blue light, green light and red light so as to act as B, G and R filters, respectively. Thus, the density sensors 31, 32 and 33 detect quantities of blue light, green light and red light, respectively. The density sensors 31, 32 and 33 are movable in the directions of the arrows in FIG. 14 so as to be moved into or away from an optical path of image forming exposure light. When the density sensors 31, 32 and 33 have been moved into the optical path of image forming exposure light, the density sensors 31, 32 and 33 detect quantities of blue light, green light and red light of image forming exposure light, i.e. density of the original document. Meanwhile in addition to the above mentioned example, colored PETP (polyethylene terephthalate) or a gelatin filter (e.g., #25, #58 and #47 commercially available from Eastman Kodak Co. of the U.S.) may also be employed as each of the color separation filters 31b, 32b and 33b.

Figure 13:
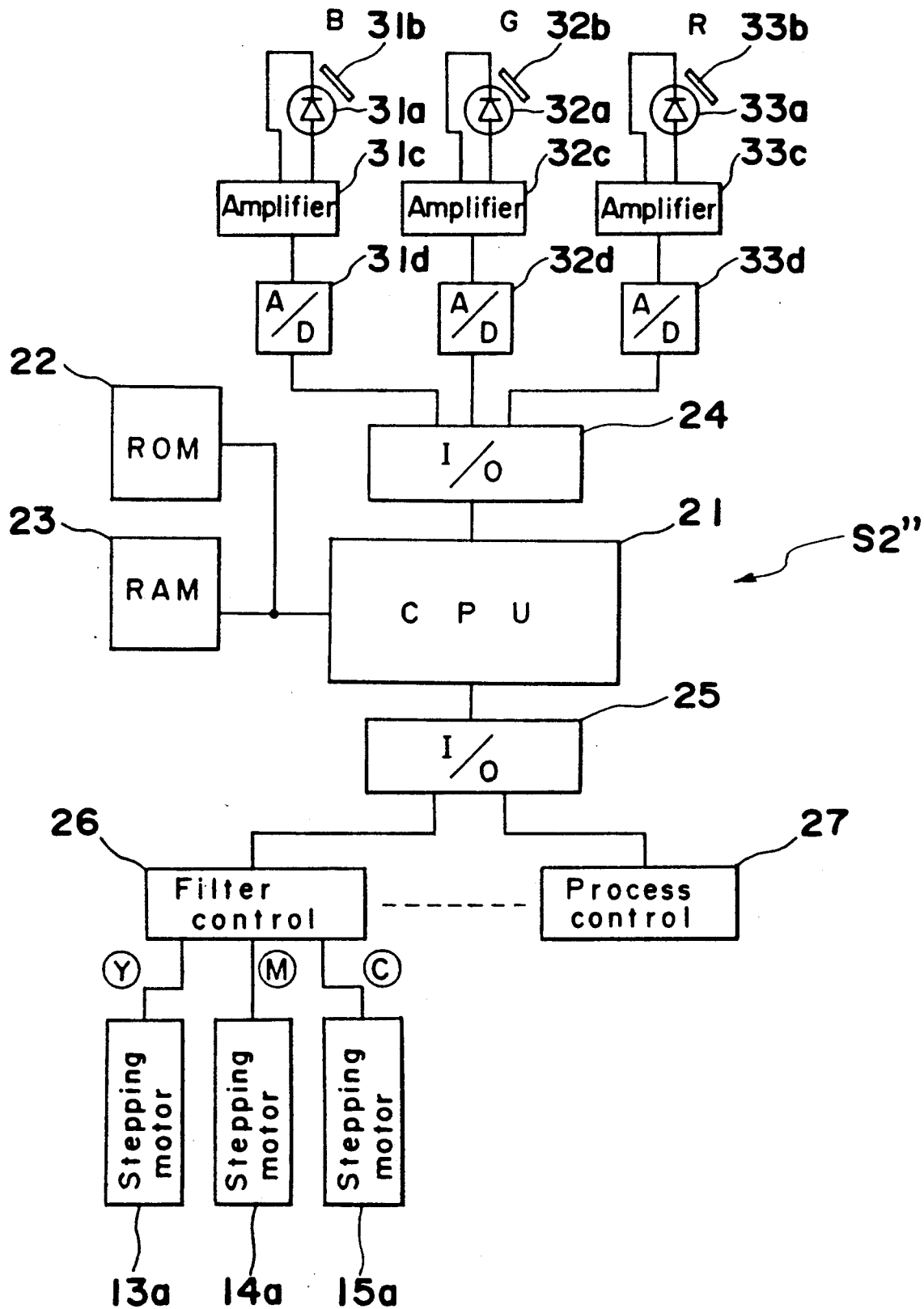
FIG. 13 is a view similar to FIG. 6, particularly showing a second modification of the copying apparatus of FIG. 5.

FIG. 13 shows a control portion of the copying apparatus S2''. Quantities of blue light, green light and red light detected by the silicon photosensors 31a, 32a and 33a are amplified by amplification circuits 31c, 32c and 33c and then, are digitalized by A-D converters 31d, 32d and 33d, respectively so as to be inputted to the CPU 21 through the I/O unit 24. For example, when an input from the silicon photosensor 33a for detecting red light is larger L than those from the silicon photosensors 31a and 32a, it is judged that the original document is reddish. At this time, an arithmetic operation is performed in the CPU 21 such that not only the ratios of areas of the Y and M filters 13 and 14 are increased but the ratio of area of the C filter 15 is reduced. Hence, in FIG. 5, the Y and M filters 13 and 14 are displaced in the direction of the arrow I, while the C filter 15 is displaced in the direction of the arrow H. Therefore, the quantity of red light is increased, so that the C capsules are readily set. Accordingly, the color of cyan is weakened and thus, a reddish image is formed.

Meanwhile, the arithmetic method is given as one example and can be changed in various ways. Thus, it can also be so arranged that various kinds of tables of arithmetic coefficients are stored in the ROM 22 and one of the tables is selected by operating a key such that data of the ratios of areas are calculated on the basis of the selected table. For example, tables of arithmetic coefficients for original documents of characters, photographs, business graphics, and the like are stored in the ROM 22 such that the copied image suitable for the respective needs are obtained Then, setting of the filters 13, 14 and 15 in accordance with characteristics of the original document is described. In order to set the filters 13, 14 and 15, the density sensors 31, 32 and 33 are initially moved into the optical path of image forming exposure light. When preliminary scanning of the original document is performed in this state, quantities of blue light, green light and red light are read by the silicon photosensors 31a, 32a and 33a, respectively so as to be CPU 21. At this time, only the optical system 20 is actuated and other devices such as the photoreceptive sheet and the image forming sheet are not actuated. In accordance with the data read by the silicon photosensors 31a, 32a and 33a as well as the earlier mentioned photo-setting characteristics of the photoreceptive sheet, the CPU 21 calculates data of the ratios of areas. The thus obtained ratios of areas of the filters 13, 14 and 15 are outputted to the filter control portion 27 so as to control the stepping motors 13a, 14a and 15a, respectively.

When preliminary scanning of the original document has been performed beforehand as described above, characteristics of the original document are read and the filters 13, 14 and 15 are displaced automatically. Therefore, troublesome setting of the filters 13, 14 and 15 based experiences or skills of the operator can be eliminated and production of defective copies can be prevented.

In the copying apparatus S2", quantities of light having specific wavelength ranges of reflected light from the original document are detected and the minute displacement distances of the filters are set on the basis of the detected quantities of light. Therefore, the filters are not required to be set based on the experience or skill of the operator as in prior art copying apparatuses and an excellent copied image can be obtained easily by any unskilled operator through reduction of defective copies.

Figure 17:
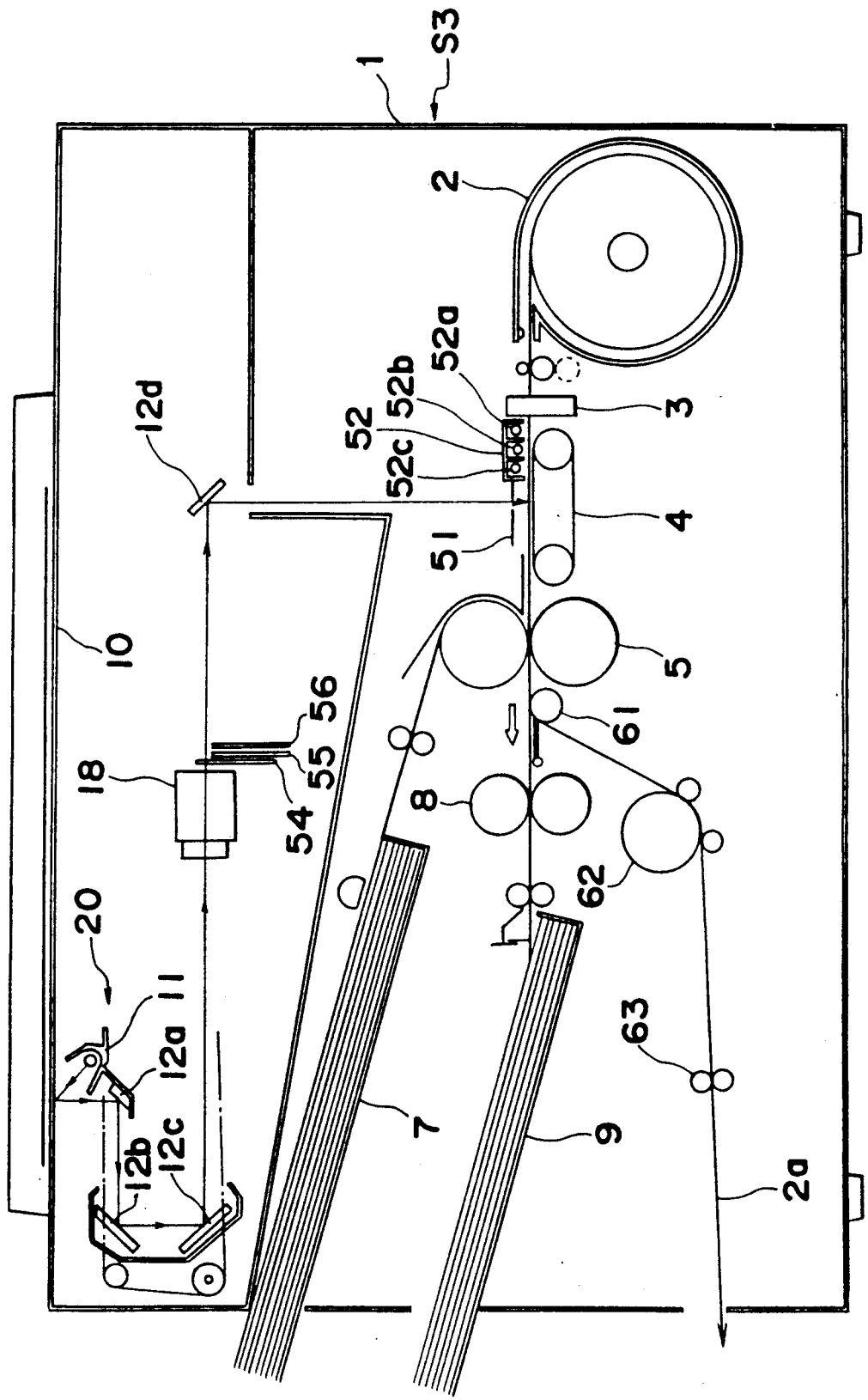
FIG. 17 is a schematic view of the copying apparatus of FIG. 16.

Referring further to FIG. 17, there is shown a slit exposure type copying apparatus S3 according to a third embodiment of the present invention. It is to be noted that the copying apparatus S3 is substantially identical with the copying apparatus S2, except that in the vicinity of the lens 18, the copying apparatus S3 includes Y, M and C filters 54, 55 and 56 movable vertically at right angles to the slit 51.

Figure 16:
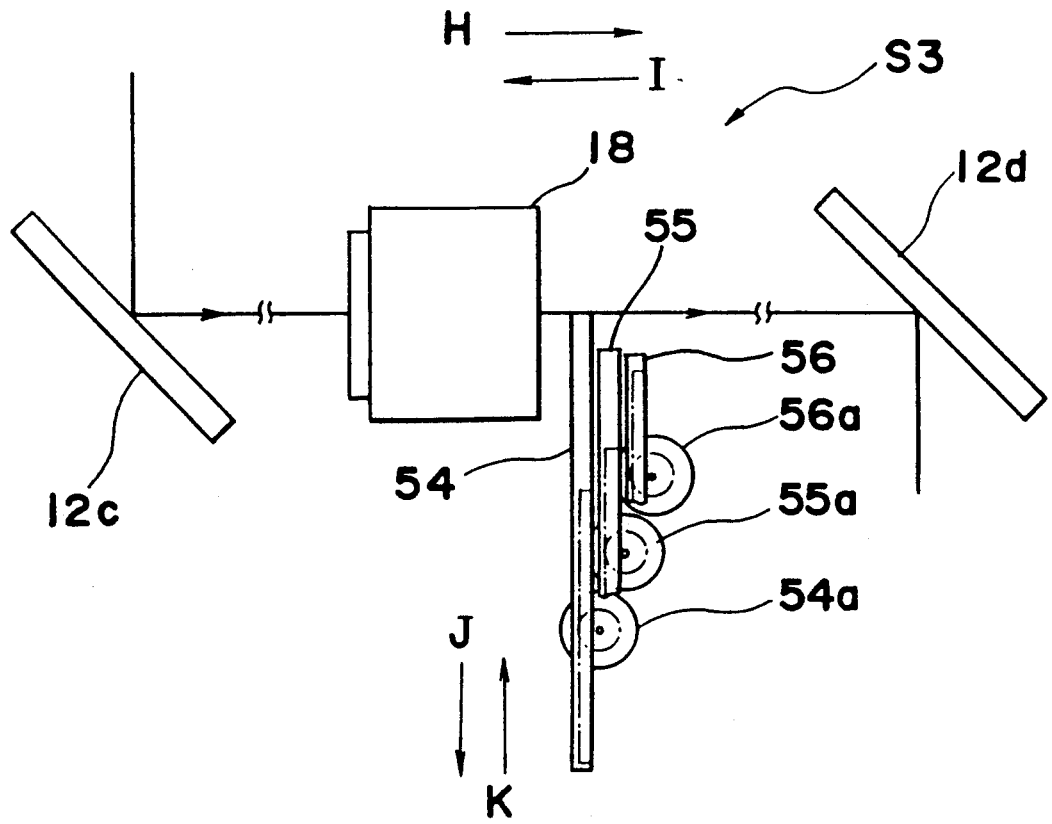
FIG. 16 is a fragmentary side elevational view of a copying apparatus according to a third embodiment of the present invention.

In FIG. 16, the lens 18 can be displaced in the direction of the arrows H and I by a movable unit (not shown). When the lens 18 is displaced in the direction of the arrow H, the copied image is reduced. On the other hand, when the lens 18 is displaced in the direction of the arrow I, the copied image is enlarged. The Y, M and C filters 54, 55 and 56 have characteristics shown in FIG. 2 and correspond to the Y, M and C filters 13, 14 and 15 of the copying apparatus S2, respectively. The filters 54, 55 and 56 are disposed rearwards of the lens 18, namely at a side of the lens 18 adjacent to an exposure point. These filters 54, 55 and 56 are provided on the movable unit of the lens 18 so as to be displaced together with the movable unit of the lens 18. Each of the filters 54, 55 and 56 has an elongated platelike shape so as to cover the lens 18. The filters 54, 55 and 56 are, respectively, displaced through minute distances vertically in directions of arrows J and K perpendicularly to the slit 51 by stepping motors 54a, 55a and 56a such that areas in which the filters 54, 55 and 56 cover the lens 18 are changed.

When the filters 54, 55 and 56 are displaced in the directions of the arrows J and K, the areas of the lens 18 covered by the filters 54, 55 and 56, namely, ratios of areas of image forming exposure light intercepted by the filters 54, 55 and 56 change. Namely, when the filters 54, 55 and 56 are displaced in the direction of the arrow J, the ratios of areas are reduced. On the contrary, when the filters 54, 55 and 56 are displaced in the direction of the arrow K, the ratios of areas are increased.

The C filter 56 exhibits the characteristics shown in FIG. 8 in the same manner as the C filter 15 of the copying apparatus S2. Furthermore, the copying apparatus has a control portion identical with that of the copying apparatus S2 shown in FIG. 6. Since FIGS. 8 and 6 have been described earlier in connection with the copying apparatus S2, description thereof is abbreviated for the sake of brevity.

By using the photoreceptive sheet 2a of FIG. 9, the gray scale was copied by the copying apparatus S3 in the same manner as in the copying apparatus S2. Sensitivity of the M capsules of the photoreceptive sheet 2a is especially low. Hence, in order to correct sensitivity of the M capsules by the filters 54, 55 and 56, the quantity of green light is relatively increased. Therefore, the ratios of areas of image forming exposure light intercepted by the Y, M and C filters 54, 55 and 56 are, respectively, set at 11%, 0% and 15% and the electric power of the light source 11 and the scanning speed are set such that the characteristic curves of the colors of yellow and cyan coincide with that of the color of magenta in FIG. 9. As a result, at the scanning speed of 5.0 mm/sec., an excellent image having a neutral gray color free from specific coloring is obtained when the electric power of the light source 11 is set at 630 W. Meanwhile, if the electric power of the light source 11 is set at 600 W, an excellent image identical with the above one is obtained at a scanning speed of 4.8 mm/sec.

As a comparative example, copying experiments of the same gray scale as described above were performed by using a known copying apparatus employing 15 filters. At this time, Y and C filters for absorbing blue light and red light in a quantity corresponding to a density of 0.6 are inserted into light of the path source 11 and the electric power of the light source and the scanning speed are set such that the characteristic curves of the colors of yellow and cyan coincide with the color of magenta in FIG. 9. As a result, at a scanning speed of 5.0 mm/sec., 880 W was required for the electric power of the light source 11. Meanwhile, if the electric power of the light source 11 is set at 600 W, the scanning speed is required to be reduced to 3.4 mm/sec.

As will be seen from the foregoing description, if the scanning speed is fixed at 5.0 mm/sec., the electric power of the light source 11 can be reduced by 250 W (=880−630) as compared with the known copying apparatus. Meanwhile, if the electric power of the light source 11 is fixed at 600 W, operating time of the copying apparatus S3 can be reduced by 1.4 mm/sec. (=4.8−3.4) as compared with the known copying apparatus, which means that a time period of about 26 sec. can be saved in the case of A-4 sized copying. Meanwhile, if copying is performed by the copying apparatus S3 on the same conditions as the known copying apparatus, for example at an electric power of the light source 11 of 880 W and a scanning speed of 5.0 mm/sec., a bright copied image can be obtained. Thus, since photo-setting characteristics, mainly sensitivity of the photoreceptive sheet 2a are corrected by using the filters 54, 55 and 56, an excellent image can be obtained.

Meanwhile, it is possible to dispose the filters 54, 55 and 56 forward of the lens 18. At this time, it is desirable that the filters 54, 55 and 56 are provided in the vicinity of the lens 18. Namely, since image forming exposure light is focused on the lens 18, areas of the filters 54, 55 and 56 can be advantageously reduced.

Accordingly, in addition to the effects of the copying apparatus S2, the copying apparatus S3 achieves such an effect that since a quantity of image forming exposure light can be adjusted by the filters provided in the vicinity of the lens having image forming exposure light focused thereon, the areas of the filters can be reduced.

Although not specifically shown, the control portion (FIG. 6) of the copying apparatus S3 can be modified into that of the copying apparatus S2' shown in FIG. 10 as in the copying apparatus S2. Thus, this modified copying apparatus produces the same effects as those of the copying apparatus S2'.

Figure 18:
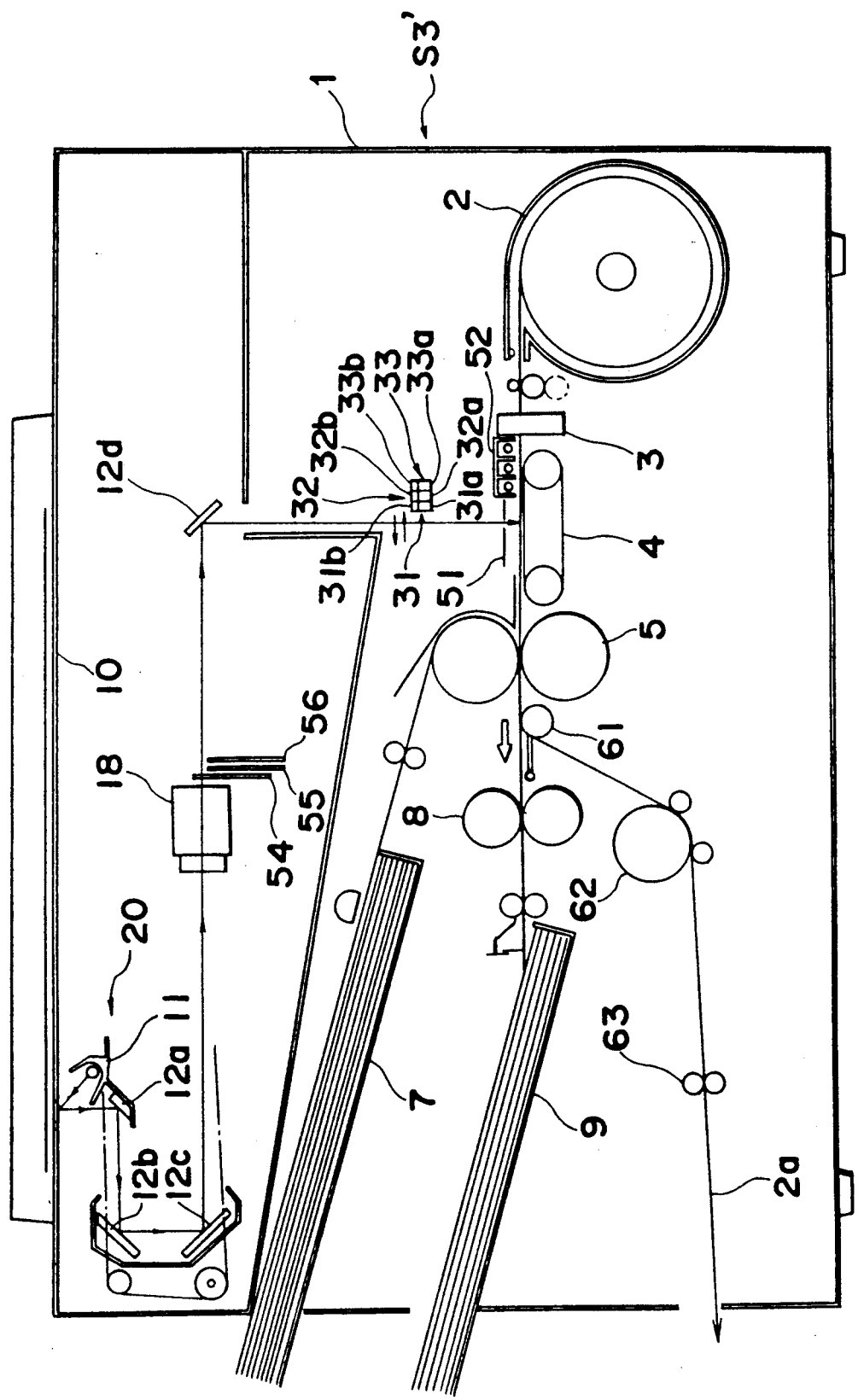
FIG. 18 is a view similar to FIG. 17, particularly showing a modification thereof.

Referring to FIG. 18, there is shown a copying apparatus S3' which is another modification of the copying apparatus S3. The copying apparatus S3' corresponds to the copying apparatus S2" of FIG. 14. Thus, the copying apparatus S3' has a control portion identical with that of the copying apparatus S2" shown in FIG. 13.

Figure 19:
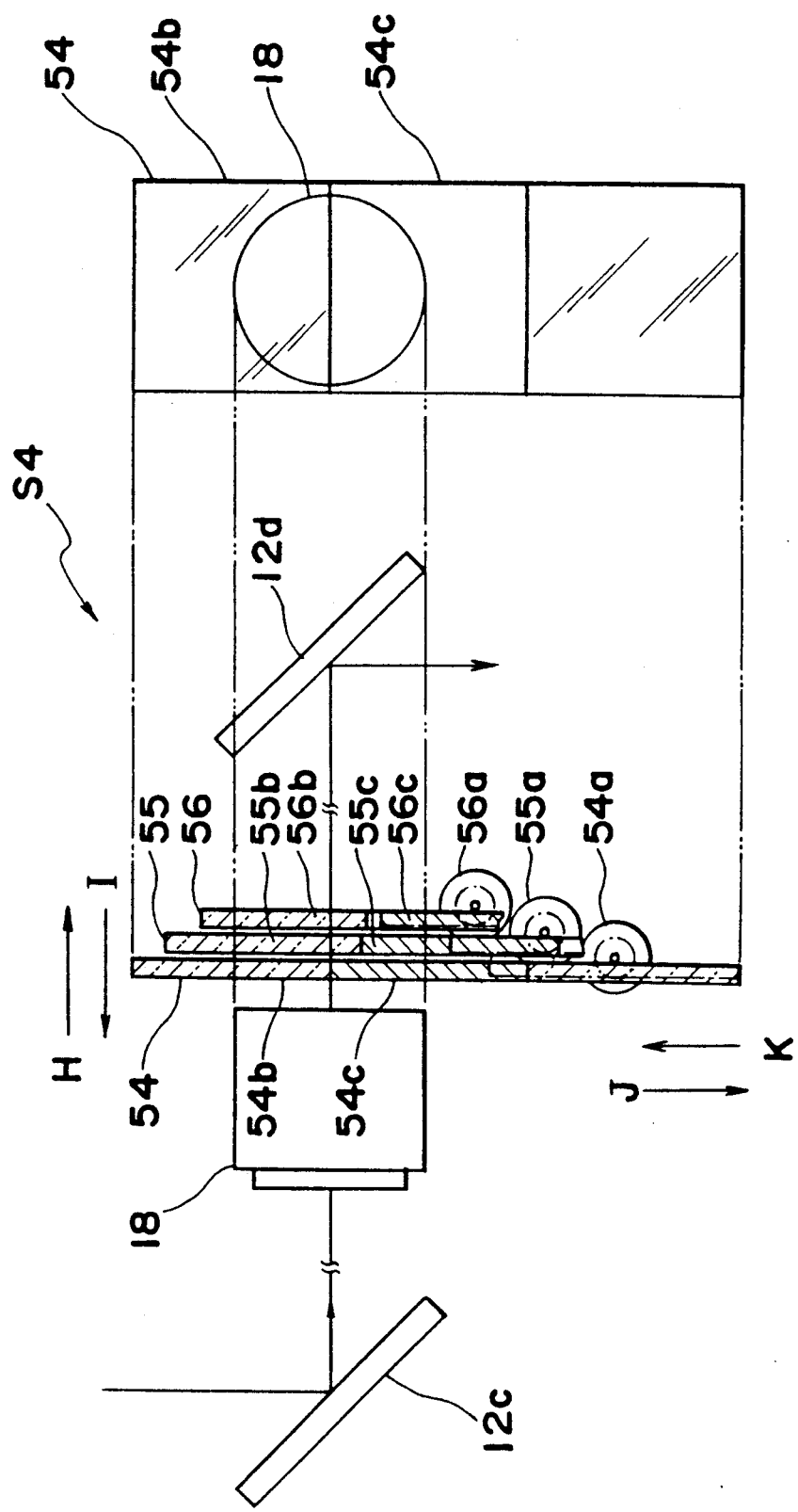
FIG. 19 is a fragmentary sectional view of a copying apparatus according to fourth embodiment of the present invention.
Figure 20:
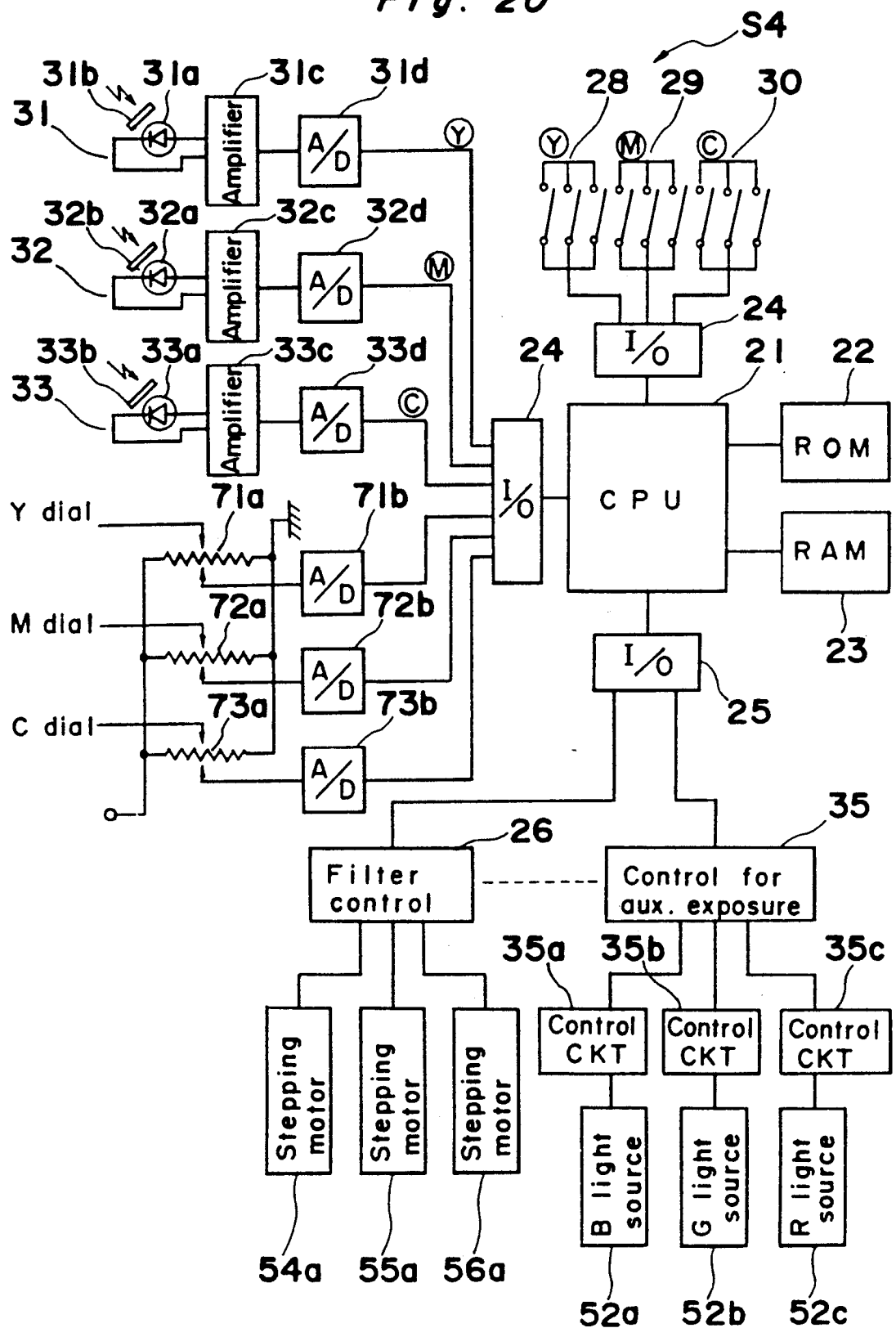
FIG. 20 is a block diagram of the copying apparatus of FIG. 19.
Figure 21:
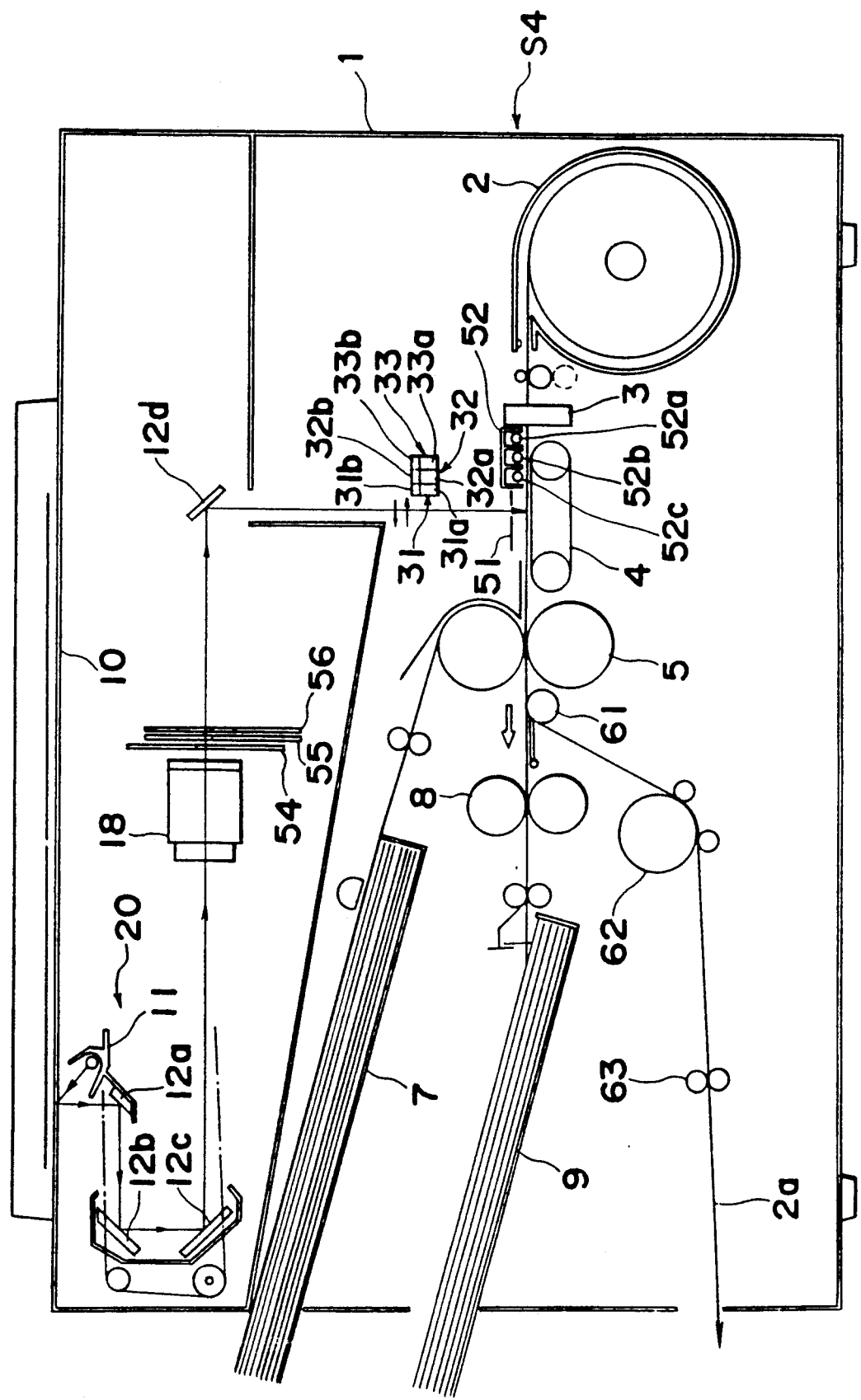
FIG. 21 is a schematic view of the copying apparatus of FIG. 19.

Referring finally to FIGS. 19 to 21, there is shown a copying apparatus S4 according to a fourth embodiment of the present invention. The copying apparatus S4 includes the dip switches 28, 29 and 30 for inputting characteristics of the photoreceptive sheet 2a, the density sensors 31, 32 and 33 for detecting color characteristics of the original document, Y, M and C color adjusting dials 71a, 72a and 73a for inputting desired colors to the copied image and the filters 54, 55 and 56 characteristic of the copying apparatus S4. In the copying apparatus S4, the filters 54, 55 and 56 and the B, G and R light sources 52a, 52b and 52c of the auxiliary exposure device 52 are adjusted by using the dip switches 28 to 30, the density sensors 31 to 33 and the color adjusting dials 71a to 73a such that an excellent image is obtained. In the RAM 23, conversion factors for calculating exposure amounts of the B, G and R light sources 52a to 52c and distances of displacement of the filters 54 to 56 on the basis of inputted data from the dip switches 28 to 30, the density sensors 31 to 33 and the color adjusting sensors 71a to 73a are stored. The exposure amounts of the B, G and R light sources 52a to 52c and the distances of displacement of the filters 54 to 56 are calculated by the CPU on the basis of the conversion factors so as to be outputted to the filter control portion 26 and the control portion 35 for controlling the auxiliary exposure device 52.

In FIG. 19, each of the filters 54 to 56 is formed by a transparent glass plate having a size which is twice a crosssectional area of the optical path of image forming exposure light. A coating layer for reflecting light of a specific wavelength range is provided on a portion of the transparent glass plate. For example, a transparent portion 54b having a size substantially equal to the cross-sectional area of the optical path is provided at an upper portion of the filter 54 and a B reflective portion 54c for reflecting blue light, for transmitting light of yellow, which has a size equal to the cross-sectional area of the optical path, is provided at a lower portion of the transparent portion 54b. Meanwhile, a support portion for supporting the filter 54 so as to displace the filter 54 vertically is provided at a lower portion of the reflective portion 54c. This support portion is not subjected to coating. In accordance with a ratio of insertion of the transparent portion 54b and the reflective portion 54c into the optical path, a quantity of blue light in the image forming exposure light is determined. Similarly, the filter 55 has a transparent portion 55b and a G reflective portion 55c for reflecting green light, for transmitting the light of magenta, while the filter 56 has a transparent portion 56b and an R reflective portion 56c for reflecting red light, thereby transmitting the light of cyan.

The transparent portions 54b to 56b almost transmit a whole of image forming exposure light but the B, G and R reflective portions 54c to 56c reflect portions of light having specific wavelength ranges so as to prevent the transmission. The B, G and R reflective portions 54c, 55c and 56c have characteristics shown in FIG. 2. A coating layer for reflecting blue light having a wavelength of 400–500 nm and for transmitting the light of yellow is formed on the B reflective portion 54c. Meanwhile, a coating layer for reflecting green light having a wavelength of 500–600 nm and for transmitting the light of magenta is formed on the G reflective portion 55c and a coating layer for reflecting red light having a wavelength of 600–700 nm and for transmitting the light of cyan is formed on the red reflective portion 56c.

When the filter 54 is displaced in the direction of the arrow J, an area occupied by the transparent portion 54b in the cross section of the optical path of the image forming exposure light is increased and the reflection of blue light in the image forming exposure light is reduced. On the other hand, when the filter 54 is displaced in the direction of the arrow K, an area occupied by the B reflective portion 54c in the cross section of the optical path of image forming exposure light is increased and thus, the quantity of blue light in the image forming exposure light is reduced through its reflection by the B reflective portion 54c. Likewise, when the filters 55 and 56 are displaced in the direction of the arrow K, quantities of green light and red light in the image forming exposure light are reduced. The filters 54, 55 and 56 are constituted by the transparent portions 54b, 55b and 55c and the reflective portions 54c, 55c and 56c, respectively. Since either one of the transparent portion and the reflective portion of each of the filters 54 to 56 is inserted into the optical path of the image forming exposure light, portions of each filter having different refractive indexes are not disposed in the image forming exposure light, so that a substantially identical optical path length is obtained in the image forming exposure light as a whole and thus, the image formed on the photoreceptive sheet does not become out of focus.

Color correction of the copying apparatus S4 is described in the following items (1) to (3).

(1) Color correction based on photo-setting characteristics of the photoreceptive sheet:

Initially, color correction based on characteristics of the photoreceptive sheet is described. Photosetting characteristics of the photoreceptive sheet, such as sensitivity of each of the Y, M and C capsules, gamma, and the like vary according to each production lot and inspection results of photo-setting characteristics of the photoreceptive sheet during the manufacturing processes are indicated on the photoreceptive sheet. The operator sets the dip switches 28 to 30 based on the indicated inspection results, so that distances of displacement of the filters 54 to 56 (ratios of areas covered by the B, G and R reflective portions 54c to 56c in the optical path of the image forming exposure light) and exposure amounts of the B, G and R light sources 52a to 52c are set and thus, color correction is performed in accordance with photo-setting characteristics of the photoreceptive sheet.

Sensitivity correction is as follows. When the gray scale is copied without using the filters 54 to 56 and the auxiliary exposure device 52, the photoreceptive sheet 2a has photo-setting characteristics shown in FIG. 9. In order to correct sensitivity of the photoreceptive sheet 2a, the quantity of green light is increased more than the quantities of blue light and red light by a quantity corresponding to a density of 0.6. When the ratios of areas covered by the B, G and R reflective portions 54c, 55c and 56c in the optical path of the image forming exposure light are set at 11%, 0% and 15%, respectively, the characteristic curves of the colors yellow and cyan coincide with that of the color magenta and thus, an excellent image free from specific coloring can be obtained.

Gamma correction is performed in the same manner as in the copying apparatus S2'. Therefore, description thereof is abbreviated for the sake of brevity.

(2) Color correction based on characteristics of the original document:

In order to perform color correction based on color characteristics of the original document, preliminary scanning of the original document is initially performed so as to detect color characteristics of the original document such that color correction is performed in accordance with the detected results. When a colored original document is placed on the original platform 10 and a preliminary scanning key on the operating panel is operated, the density sensors 31 to 33 are displaced into the optical path of image forming exposure light. Hence, the original document is scanned by the optical system 20 and quantities of blue light, green light and red light are detected by the density sensors 31 to 33, respectively. At the time of preliminary scanning, only the optical system 20 is actuated and thus, an image forming operation is not performed. In accordance with results detected by the density sensors 31 to 33, the CPU 21 calculates distances of displacement of the filters 54 to 56 on the basis of the conversion factors stored in the RAM 23. Meanwhile, when preliminary scanning has been completed, the density sensors 31 to 33 are displaced out of the optical path of image forming exposure light.

When a print switch on the operating panel is operated, the filters 54 to 56 are displaced in accordance with the above described calculated distances of displacement of the filters 54 to 56 so as to correct image forming exposure light and thus, an excellent image can be obtained. For example, when the original document is reddish, input from the density sensor 33 for detecting red light becomes larger than those from the density sensors 31 and 32. In this case, an arithmetic operation is performed such that ratios of insertion of the B and C reflective portion 54c and 55c into the optical path of image forming exposure light are made larger than that of the R reflective portion 56c. Meanwhile, data based on photo-setting characteristics of the photoreceptive sheet referred to in the above item (1) are also used for this arithmetic operation. In accordance with results of the arithmetic operation, the filter control portion 26 displaces the filters 54 and 55 in the direction of the arrow K and the filter 56 in the direction of the arrow J. As a result, the quantity of red light in the image forming exposure light is relatively increased, so that the C capsules are readily cured and thus, a reddish copied image is obtained.

Meanwhile, in the case where color correction is performed in accordance with color characteristics of the original document, desirable image characteristics may change according to the kinds of original document such as documents of characters, photographs, business graphics, and objects of usage. In such a case, it is desirable that the method of calculating the distances of displacement of the filters are changed. For example, in the case where an original document having specific coloring is copied such that the specific coloring appears in the copied image as it is, color correction can be performed by the above described arithmetic operation. However, if the operator wishes to delete the specific coloring from the copied image, an arithmetic operation opposite to that referred to above should be performed. Therefore, if a plurality of kinds of different calculating methods are stored in the RAM 23 such that one of the calculating methods is selected in accordance with use applications, a wide range of color correction desired by the operator can be performed. Thus, if color characteristics of the original document are detected by preliminary scanning and the filters are automatically displaced in accordance with the detected color characteristics of the original document such that color correction is performed, an excellent copied image can be obtained at all times without the need for additional experience and skill by the operator.

(3) Coloring based on the operator's desire:

Data on colors of coloring desired by the operator and the densities are inputted from the Y, M and C color adjusting dials. For example, when the Y color adjusting dial is rotated, data on density of the color yellow is inputted. Similarly, when the M and C color adjusting dials are rotated, data on densities of the colors magenta and cyan are inputted. In accordance with these inputted data, the distances of displacement of the filters 54 to 56 are calculated. For example, when data indicates that density of the color yellow is increased, the quantity of blue light should be reduced such that the Y capsules are not set. Therefore, the filter 54 is displaced in the direction of the arrow K such that the ratio of insertion of the B reflective portion 54c into the optical path is increased, while the filters 55 and 56 are displaced in the direction of the arrow J. Meanwhile, the distances of displacement of the filters 54 to 56 change according to the densities of colors desired by the operator.

In this way, a copied image having specific coloring can be obtained. In addition to the dial, color adjusting data can be inputted by a slide knob, a key, or the like.

Meanwhile, in the item (2) color correction based on characteristics of the original document and the item (3) coloring based on the operator's desire, the distances of displacement of the filters 54 to 56 are set in accordance with characteristics of the photoreceptive sheet and data inputted from the dials. However, it can also be so arranged that color correction or coloring is performed by setting an exposure amount of the auxiliary exposure device 52.

As will be seen from the above items (1) to (3), a copied image responsive to characteristics of the photoreceptive sheet, characteristics of the original document and the operator's personal preference can be obtained.

Meanwhile, in the copying apparatus S4, the filters can be disposed at any location in the course of the optical path of the image forming exposure light, for example, between the light source 11 and the original platform 10. Also in this case, if each filter is divided into the transparent portion and the reflective portion perpendicularly to the slit, the copied image is not nonuniformly colored partially.

In the copying apparatus S4, image quality of the copied image can be adjusted by the filters each of which is divided into the reflective portion and the transparent portion perpendicularly to the slit. Since the quantity of light absorbed or reflected by each filter can be adjusted by changing the distance of displacement of each filter, the number of the necessary filters can be minimized. Therefore, the arrangement of the filters can be made compact and the filters can be controlled simply. In addition, since a decrease of the quantity of image forming exposure light can be minimized, the necessity for a larger light source and a drop in the scanning speed, which are caused by a decrease of image forming exposure light, can be minimized. Moreover, since either one of the transparent portion and the reflective portion of each filter is inserted into the optical path of image forming exposure light, partial difference in optical path length does not take place and thus, the formed image does not become in focus.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. An image forming apparatus including an auxiliary exposure device, in which a photoreceptive sheet coated with photosensitive microcapsules is subjected to image forming exposure and auxiliary exposure so as to form a selectively set image thereon by the photosensitive microcapsules, said apparatus comprising:
    transport means for transporting the photoreceptive sheet at a predetermined speed;
    a light source lamp for applying image forming exposure light to an original document to be copied;
    sensor means for detecting a quantity of light reflected from the original document;
    slit exposure means for subjecting the photoreceptive sheet being displaced at the predetermined speed to exposure of an image of the original document through a slit;
    said auxiliary exposure device confronting the photoreceptive sheet for correcting gamma characteristics of said photoreceptive sheet;
    a plurality of filters for absorbing or reflecting portions of light emitted by said light source lamp according to specific ranges of wavelengths of the portions of the light of said light source lamp, respectively, the filters being adjustable in the direction of transport of the photoreceptive sheet; and
    setting means for setting ratios of areas of said light source lamp covered by said filters, respectively in response to an output by said sensor means.

2. An image forming apparatus as claimed in claim 1, wherein said filters include first, second and third filters for absorbing or reflecting blue light, green light and red light, respectively.

3. A slit exposure type image forming apparatus for copying an original document including an image forming exposure device, in which a photoreceptive sheet is subjected to image forming exposure light through a slit so as to form an image thereon, said image forming exposure device comprising:
    sensor means for detecting a quantity of light reflected from the original document;
    filter means for absorbing or reflecting light having a specific wavelength range in image forming exposure light, which is provided in the course of an optical path between the original document and the photoreceptive sheet and can be incrementally displaced so as to correct sensitivity of said photoreceptive sheet;
    means for adjusting said filter means in response to a quantity of light detected by said sensor means; and
    auxiliary exposure means for correcting photo-setting characteristics of said photoreceptive sheet.

4. An image forming apparatus as claimed in claim 3, wherein said filter means is constituted by first, second and third filters for absorbing or reflecting blue light, green light and red light, respectively.

5. An image forming apparatus as claimed in claim 3, wherein said image forming exposure device further comprises:
    an input means for inputting photo-setting characteristics of said photoreceptive sheet; and
    a setting means for setting the minute distance of said filter means on the basis of the photo-setting characteristics inputted by said input means.

6. An image forming apparatus as claimed in claim 5, wherein said filter means is constituted by first, second and third filters for absorbing or reflecting blue light, green light and red light, respectively.

7. A slit exposure type image forming apparatus including an image forming exposure device, in which a photoreceptive sheet is subjected to image forming exposure through a lens and a slit so as to form an image thereon, said image forming exposure device comprising:
    sensor means for detecting a quantity of light reflected form an original document;
    filter means for absorbing or reflecting light having a specific wavelength range of image forming exposure light, which is provided in an optical path between the original document ad the photoreceptive sheet at right angles to said slit so as to be incrementally displaced with respect to said lens in response to output by said sensor means thereby correcting sensitivity of said photoreceptive sheet; and
    auxiliary exposure means for correcting photo-setting characteristics of said photoreceptive sheet.

8. An image forming apparatus as claimed in claim 7, wherein said filter means is constituted by first, second and third filters for absorbing or reflecting blue light, green light and red light, respectively.

9. A slit exposure type image forming apparatus including an image forming exposure device, in which a photoreceptive sheet is subjected to image forming exposure through a slit so as to form an image thereon, said image forming exposure device comprising:
    sensor means for detecting a quantity of light reflected from an original document;
    filter means which is provided in the course of an optical path between the original document and the photoreceptive sheet at right angles to said slit and has a size larger than a cross section of the optical path;
    said filter means being divided horizontally relative to said image forming apparatus into a transparent portion and a transmitting portion for transmitting light having a specific wavelength range in the image forming exposure light for correcting sensitivity of said photoreceptive sheet;
    displacement means, responsive to said sensor means, for incrementally displacing said filter means in a scanning direction of the slit in such a range that said filter means contains the cross section of the optical path completely; and
    auxiliary exposure means for correcting photo-setting characteristics of said photoreceptive sheet.

10. An image forming apparatus as claimed in claim 9, wherein said filter means is constituted by first, second and third filters including first, second and third transmitting portions for transmitting light of yellow, light of magenta and light of cyan, respectively.

11. An image forming apparatus comprising:
    means for receiving an original document to be copied by said image forming apparatus;
    a photoreceptive sheet for receiving an image corresponding to the original document;
    a support member for supporting said photoreceptive sheet;
    image forming exposure means for scanning the original document and applying image forming exposure light through a slit to said photoreceptive sheet, said image forming exposure means further correcting sensitivity of said photoreceptive sheet;
    density sensor means for detecting a density of said original document in a preliminary scanning operation by said image forming exposure means; and
    auxiliary exposure means for correcting gamma of said photoreceptive sheet.

12. An image forming exposure apparatus as claimed in claim 11, wherein said density sensor means includes a plurality of density sensor each having a photosensor, a color separation filter, and means for moving said color separation filter into and out of an optical path of said image forming exposure light, wherein correction of sensitivity of said photoreceptivce sheet by said image forming exposure means is in response to detection by said density sensor means.

13. An image forming apparatus as claimed in claim 11, wherein said image forming exposure means includes a light source and a plurality of filters interposed between said light source and the original document, and means for adjusting said plurality of filters to correct the sensitivity of said photoreceptive sheet and impart a selected coloring to an image formed on said photoreceptive sheet.

14. An image forming apparatus as claimed in claim 13, wherein said plurality of filters are reflection-type filters.

15. An image forming apparatus as claimed in claim 13, wherein said plurality of filters are absorption-type filters.

16. An image forming apparatus as claimed in claim 11, wherein said light source includes a filter for absorbing near-infrared rays from said light source.

17. An image forming apparatus as claimed in claim 11, wherein said auxiliary exposure means includes a plurality of light sources for uniformly exposing said photoreceptive sheet, each of said plurality of light sources emitting a different colored light, whereby photo-setting characteristics of said photoreceptive sheet are corrected.

18. An image forming apparatus as claimed in claim 17, wherein said photo-setting characteristics include gamma of said photoreceptive sheet.

19. An image forming apparatus as claimed in claim 13, wherein said plurality of filters are positioned to be adjustable in a direction perpendicular to a lengthwise direction of said slit, thereby preventing a non-uniform exposure of colors by said plurality of filters.

20. An image forming apparatus comprising:
    means for receiving an original document to be copied by said image forming apparatus;
    a photoreceptive sheet for receiving an image corresponding thereto on the original document;
    a support member for supporting said photoreceptive sheet;
    image forming exposure means for scanning the original document and applying image forming exposure light through a slit to said photoreceptive sheet, said image forming exposure means including an optical magnification lens in the path of said image forming exposure light;
    auxiliary exposure means for correcting gamma of said photoreceptive sheet;
    filter means insertable into the path of said image forming exposure light adjacent the optical magnification lens perpendicular to said slit for correcting sensitivity of said photoreceptive sheet;
    density sensor means for detecting a density of said original document in a preliminary scanning operation by said image forming exposure means.

21. An image forming apparatus as claimed in claim 20, wherein said auxiliary exposure means includes a plurality of light sources for uniformly exposing said photoreceptive sheet, each of said plurality of light sources emitting a different colored light, whereby photo-setting characteristics of said photoreceptive sheet are corrected.

22. An image forming apparatus as claimed in claim 21, wherein said photo-setting characteristics include gamma of said photoreceptive sheet.

* * * * *